US012596406B2

(12) United States Patent
Kang et al.

(10) Patent No.: US 12,596,406 B2
(45) Date of Patent: Apr. 7, 2026

(54) ELECTRONIC DEVICE COMPRISING DRIVING ELEMENT

(71) Applicant: Samsung Electronics Co., Ltd.,
Suwon-si (KR)

(72) Inventors: Youngmin Kang, Suwon-si (KR);
Seungjoon Lee, Suwon-si (KR);
Moonchul Shin, Suwon-si (KR);
Yeonggyu Yoon, Suwon-si (KR);
Joongyeon Cho, Suwon-si (KR);
Junyoung Choi, Suwon-si (KR);
Hyunggwang Kang, Suwon-si (KR);
Byounguk Yoon, Suwon-si (KR);
Gabseong Lee, Suwon-si (KR); **Wonho
Lee**, Suwon-si (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 171 days.

(21) Appl. No.: 18/649,332

(22) Filed: Apr. 29, 2024

(65) Prior Publication Data

US 2024/0284619 A1 Aug. 22, 2024

Related U.S. Application Data

(63) Continuation of application No.
PCT/KR2022/014044, filed on Sep. 20, 2022.

(30) Foreign Application Priority Data

Oct. 29, 2021 (KR) ........................ 10-2021-0146793
Dec. 17, 2021 (KR) ........................ 10-2021-0181238

(51) Int. Cl.
*G06F 1/16* (2006.01)
*H04M 1/02* (2006.01)
*H05K 5/02* (2006.01)

(52) U.S. Cl.
CPC .......... *G06F 1/1652* (2013.01); *G06F 1/1616*
(2013.01); *G06F 1/1624* (2013.01);
(Continued)

(58) Field of Classification Search
CPC .... G06F 1/1652; G06F 1/1624; G06F 1/1616;
G06F 1/1675; H04M 1/0268; H04M
1/0237; H04M 1/0235
See application file for complete search history.

(56) References Cited

U.S. PATENT DOCUMENTS 10,582,629 B2 * 3/2020 Xu ........................... G09F 9/301
11,561,576 B2 * 1/2023 Kang ..................... G06F 1/1652
(Continued)

FOREIGN PATENT DOCUMENTS

CN 111627340 9/2020
CN 113114818 A 7/2021
(Continued)

OTHER PUBLICATIONS

Extended European Search Report dated Nov. 26, 2024 issued in
European Patent Application No. 22887356.8.
(Continued)

*Primary Examiner* — Nidhi Thaker
(74) *Attorney, Agent, or Firm* — Nixon & Vanderhye,
P.C.

(57) ABSTRACT

An electronic device according to an embodiment of the
present disclosure may comprise: a housing comprising a
first housing and a second housing accommodating at least
one part of the first housing and configured to guide sliding
movement of the first housing; a display configured to be
extended based on the sliding movement of the first housing;
and a driving element formed so as to provide a driving force
for the sliding movement of the first housing. The driving
element may comprise: a shaft structure comprising a shaft
(Continued)

and a sliding portion configured to slide relative to the shaft; an arm structure comprising a first arm, rotatably connected to the first housing and the sliding portion, and a second arm rotatably connected to the second housing and the sliding portion; an elastic structure comprising a spring surrounding at least a part of the shaft and configured to provide elasticity to the sliding portion; and a link structure comprising a first link, rotatably connected to the shaft and the first arm, and a second link rotatably connected to the shaft and the second arm.

15 Claims, 15 Drawing Sheets

(52) U.S. Cl.
CPC ....... *H04M 1/0235* (2013.01); *H04M 1/0268* (2013.01); *G06F 1/1675* (2013.01); *H04M 1/0237* (2013.01); *H05K 5/0226* (2013.01)

(56) References Cited

U.S. PATENT DOCUMENTS

| | | | | |
|---|---|---|---|---|
| 11,974,406 B2* | 4/2024 | Lee | .................. | G06F 1/1637 |
| 11,989,061 B2* | 5/2024 | Cho | .................. | G06F 1/1637 |
| 12,022,255 B2* | 6/2024 | Park | .................. | H04R 1/2819 |
| 12,443,236 B2* | 10/2025 | Kang | .................. | G06F 1/1652 |
| 2010/0177020 A1 | 7/2010 | Bemelmans et al. | | |
| 2013/0058063 A1 | 3/2013 | O'Brien | | |
| 2016/0170450 A1 | 6/2016 | Kim et al. | | |
| 2018/0070467 A1 | 3/2018 | Kim et al. | | |
| 2018/0374411 A1 | 12/2018 | Yang et al. | | |
| 2019/0250669 A1 | 8/2019 | Liao et al. | | |
| 2019/0268455 A1 | 8/2019 | Baek et al. | | |
| 2020/0081495 A1 | 3/2020 | Lin | | |
| 2020/0192434 A1* | 6/2020 | Huang | .................. | G06F 1/1681 |
| 2020/0304613 A1* | 9/2020 | Cha | .................. | G06F 1/1652 |
| 2021/0099557 A1* | 4/2021 | Cha | .................. | H04M 1/0237 |
| 2021/0195009 A1* | 6/2021 | Choi | .................. | G06F 1/1652 |
| 2021/0216108 A1 | 7/2021 | Lee et al. | | |
| 2021/0320992 A1* | 10/2021 | Song | .................. | G06F 1/1624 |
| 2021/0337049 A1* | 10/2021 | Noh | .................. | G06F 3/04817 |
| 2021/0407345 A1 | 12/2021 | Wang et al. | | |
| 2022/0147101 A1* | 5/2022 | Shin | .................. | G06F 1/1652 |
| 2022/0174829 A1* | 6/2022 | Choi | .................. | G06F 1/1624 |
| 2022/0263932 A1* | 8/2022 | Jo | .................. | H04M 1/0268 |
| 2023/0100316 A1 | 3/2023 | Chen et al. | | |
| 2023/0283697 A1* | 9/2023 | Kim | .................. | G09F 9/30 |
| | | | | 455/575.4 |

FOREIGN PATENT DOCUMENTS

| | | | |
|---|---|---|---|
| CN | 115225737 A | 10/2022 |
| JP | 2009109812 A | 5/2009 |
| JP | 2019537256 A | 12/2019 |
| KR | 20070057911 A | 6/2007 |
| KR | 100973299 B1 | 7/2010 |
| KR | 20160073466 A | 6/2016 |
| KR | 20170025520 A | 3/2017 |
| KR | 20170136907 A | 12/2017 |
| KR | 20180107065 A | 10/2018 |
| KR | 20190001389 A | 1/2019 |
| KR | 20190101605 A | 9/2019 |
| KR | 20200111083 A | 9/2020 |
| WO | 2021141160 A1 | 7/2021 |
| WO | 2022001346 A1 | 1/2022 |
| WO | 2022014908 A1 | 1/2022 |
| WO | 2022050585 A1 | 3/2022 |

OTHER PUBLICATIONS

International Search Report for PCT/KR2022/014044 dated Dec. 22, 2022, 5 pages.
Written Opinion of the ISA for PCT/KR2022/014044 dated Dec. 22, 2022, 5 pages.

* cited by examiner

ELECTRONIC DEVICE COMPRISING DRIVING ELEMENT

CROSS-REFERENCE TO RELATED APPLICATIONS

This application is a continuation of International Application No. PCT/KR2022/014044 designating the United States, filed on Sep. 20, 2022, in the Korean Intellectual Property Receiving Office and claiming priority to Korean Patent Application Nos. 10-2021-0146793, filed on Oct. 29, 2021, and 10-2021-0181238, filed on Dec. 17, 2021, in the Korean Intellectual Property Office, the disclosures of each of which are incorporated by reference herein in their entireties.

BACKGROUND

Field

The disclosure relates to an electronic device including a driving element.

Description of Related Art

With the development of information and communication technology and semiconductor technology, various functions are packed in one portable electronic device. For example, an electronic device may implement not only communication functions but also entertainment functions, such as playing games, multimedia functions, such as playing music and videos, communication and security functions for mobile banking, and scheduling and e-wallet functions. These electronic devices have been downsized to be conveniently carried by users.

As mobile communication services extend up to multimedia service sectors, electronic devices require a larger display to allow users satisfactory use of multimedia services as well as voice call or text messaging services. This, however, trades off the trend of electronic devices being compact.

SUMMARY

According to an example embodiment of the disclosure, an electronic device may comprise: a housing including a first housing and a second housing configured to receive at least a portion of the first housing and guiding a slide of the first housing, a display configured to be extended based on a slide of the first housing, and a driving element configured to provide a driving force sliding the first housing. The driving element may include a shaft structure including a shaft and a slide part configured to slide with respect to the shaft, an arm including a first arm rotatably connected to the first housing and the slide part and a second arm rotatably connected to the second housing and the slide part, an elastic structure comprising a spring surrounding at least a portion of the shaft and configured to provide an elastic force to the slide part, and a link structure including a first link rotatably connected to the shaft and the first arm and a second link rotatably connected to the shaft and the second arm.

According to an example embodiment of the disclosure, an electronic device may comprise: a housing including a first housing and a second housing configured to receive at least a portion of the first housing and configured to guide sliding of the first housing, a display configured to be extended based on the slide of the first housing, and a driving element configured to provide a driving force for the slide of the first housing. The driving element may include a shaft, an arm including a first arm including a first end portion rotatably connected to the first housing and a second end portion rotatably connected to the shaft and a second arm including a third end portion rotatably connected to the second housing and a fourth end portion rotatably connected to the shaft, an elastic structure comprising a spring connected to the shaft structure and configured to provide an elastic force to the shaft, and a link structure including a first link rotatably connected to the shaft and the first arm and a second link rotatably connected to the shaft and the second arm.

According to an example embodiment of the disclosure, the driving element may include: a shaft structure including a shaft and a slide part configured to slide with respect to the shaft, an arm structure including a first arm including a first end portion and a second end portion rotatably connected to the shaft structure and a second arm including a third end portion and a fourth end portion rotatably connected to the shaft structure, an elastic structure comprising a spring surrounding at least a portion of the shaft and configured to provide an elastic force to the slide part, and a link structure including a first link rotatably connected to the shaft and the first arm and a second link rotatably connected to the shaft and the second arm.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
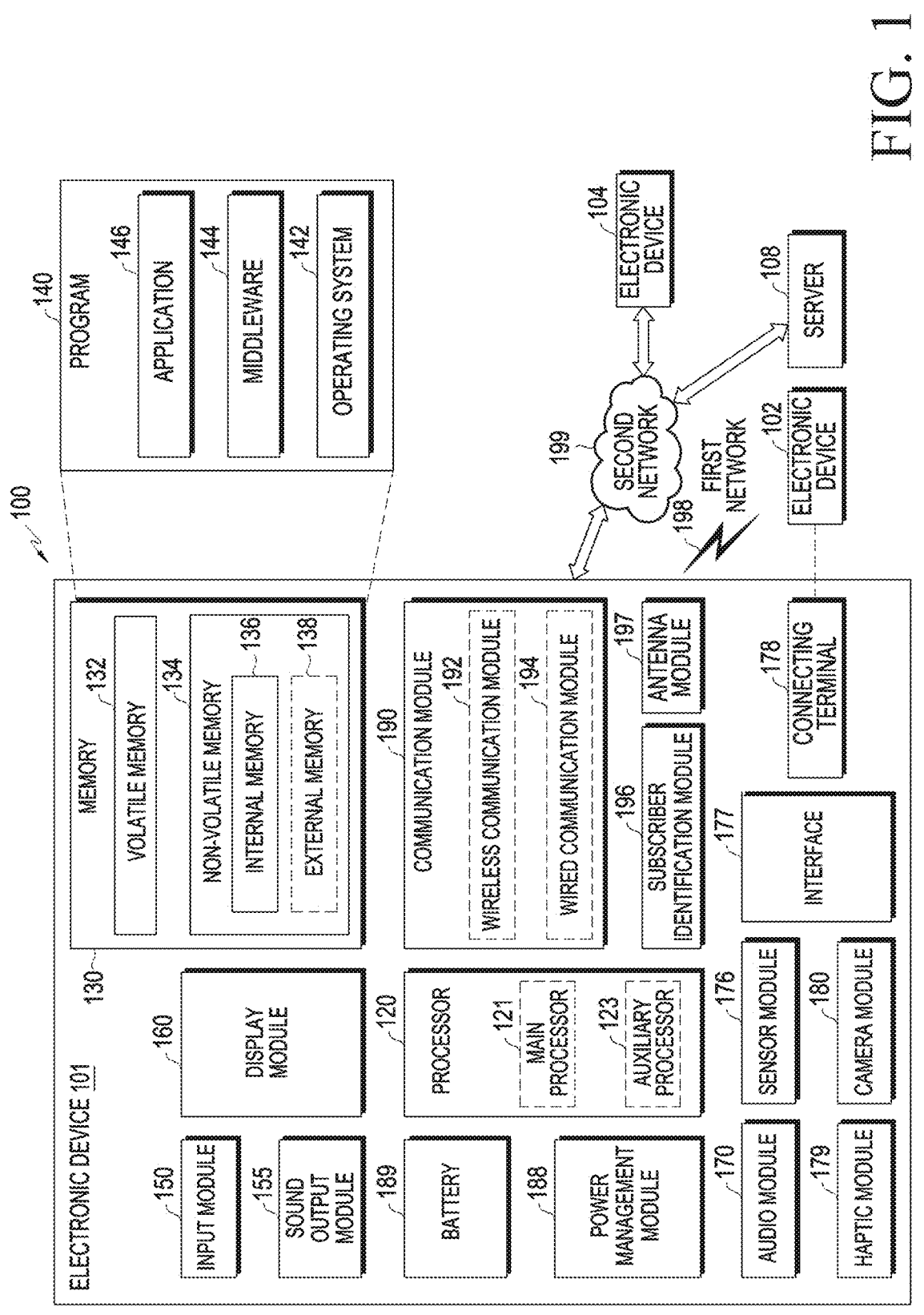
FIG. 1 is a block diagram illustrating an example electronic device in a network environment according to various embodiments.

FIG. 1 is a block diagram illustrating an example electronic device in a network environment according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal According to an embodiment, the display module 160 may include a first display module 351 corresponding to the user's left eye and/or a second display module 353 corresponding to the user's right eye, a haptic module 179, a camera module 180, a power management module 188, a battery 189, a communication module 190, a subscriber identification module (SIM) 196, or an antenna module 197. In an embodiment, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions. The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module).

A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mm Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, instructions or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
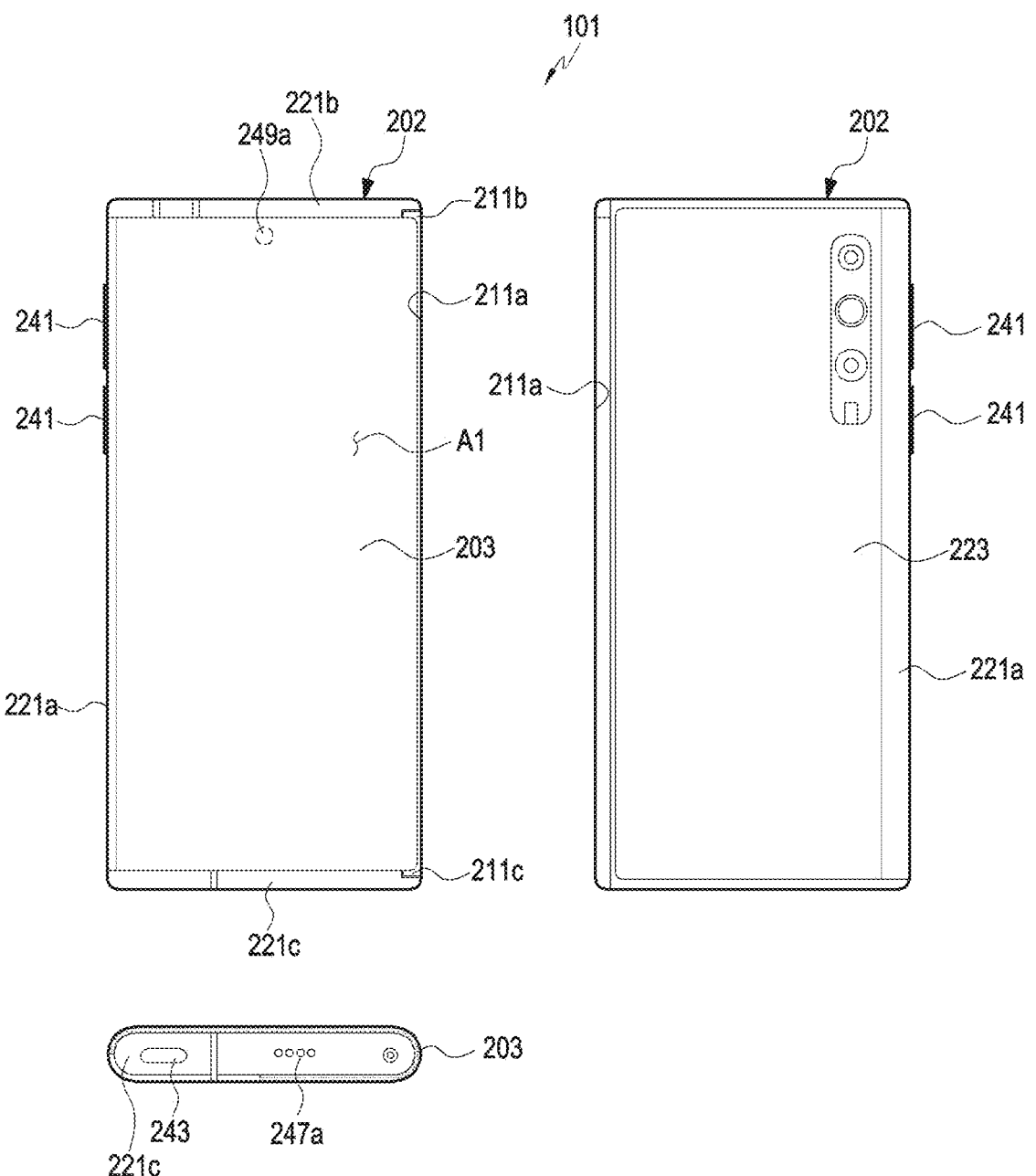
FIG. 2 is a diagram illustrating an electronic device in a closed state, according to various embodiments.
Figure 3:
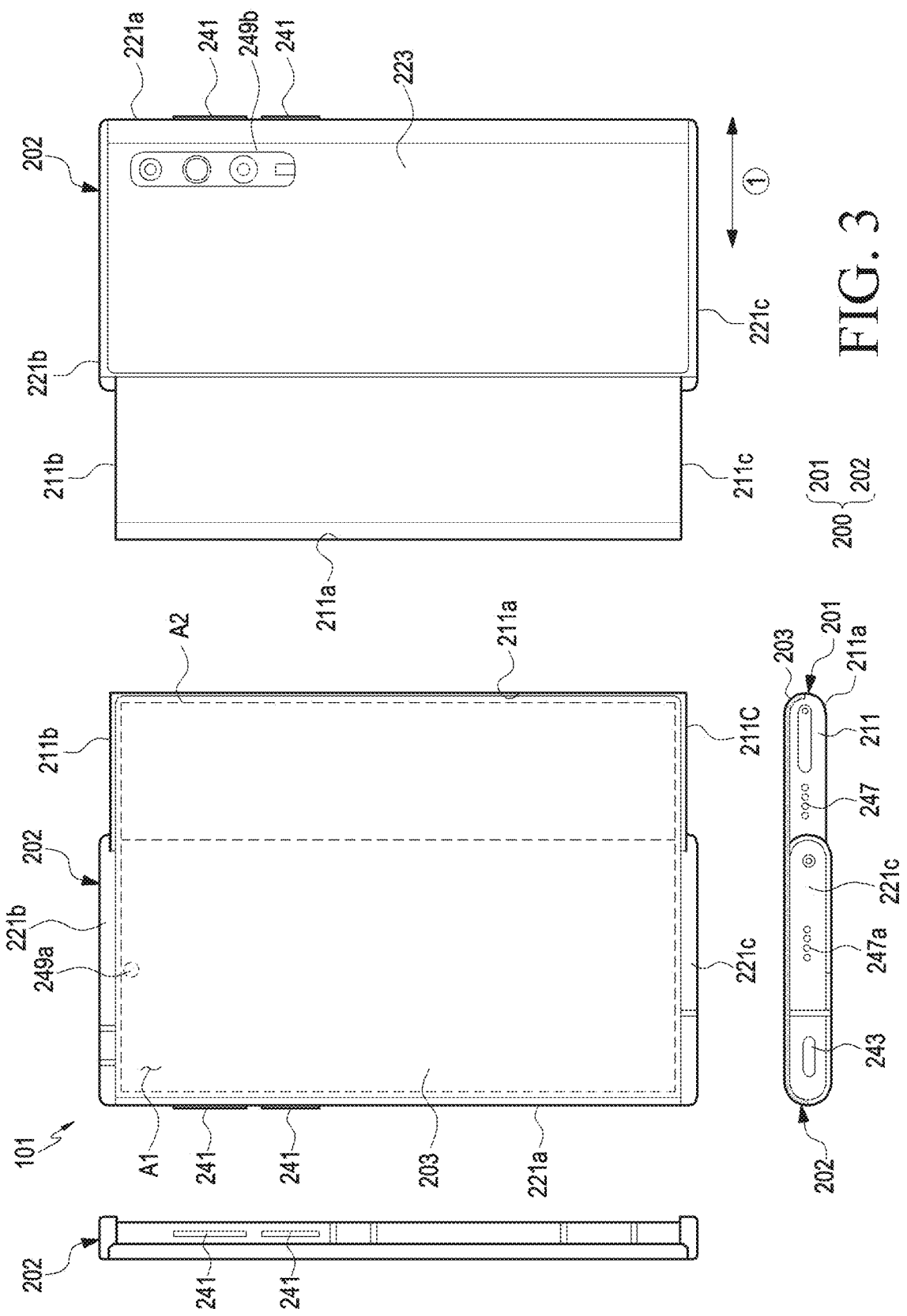
FIG. 3 is a view illustrating an electronic device in an open state, according to various embodiments.

FIG. 2 is a diagram illustrating an electronic device in a closed state, according to various embodiments. FIG. 3 is a diagram illustrating an electronic device in an open state, according to various embodiments. For example, FIG. 2 is a view illustrating a state in which a second display area A2 is received in a housing 202. FIG. 3 is a view illustrating a state in which at least a portion of the second display area A2 is visually exposed (e.g., visible) to the outside of the housing 202. As used herein, the terms "visually exposed" and "visible" may be used interchangeably and include a state in which the display may include a cover glass, protective layer, or the like.

The state shown in FIG. 2 may be denoted as a first housing 201 being closed with respect to a second housing 202, and the state shown in FIG. 2 may be denoted as the first housing 201 being open with respect to the second housing 202. According to an embodiment, the "closed state" or "opened state" may be defined as a closed or open state of the electronic device.

Referring to FIGS. 2 and 3, the electronic device 101 may include a housing 200. The housing 200 may include a second housing 202 and a first housing 201 that is movable with respect to the second housing 202. According to an embodiment, the electronic device 101 may be interpreted as having a structure in which the second housing 202 is slidably disposed on the first housing 201. According to an embodiment, the first housing 201 may be disposed to perform reciprocating motion by a predetermined distance in a predetermined direction with respect to the second housing 202, for example, a direction indicated by an arrow (1). The configuration of the electronic device 101 of FIGS. 2 and 3 may be identical in whole or part to the configuration of the electronic device 101 of FIG. 1.

According to an embodiment, the first housing 201 may be referred to as, e.g., a first structure, a slide part, or a slide housing, and may be disposed to reciprocate on the second housing 202. According to an embodiment, the second housing 202 may be referred to as, e.g., a second structure, a main part, or a main housing. The second housing 202 may receive at least a portion of the first housing 201 and may guide the slide of the first housing 201. According to an embodiment, the second housing 202 may receive various electrical and electronic components, such as a main circuit board or a battery. According to an embodiment, at least a portion (e.g., the first display area A1) of the display 203 may be visually exposed to the outside of the housing 200. According to an embodiment, another portion (e.g., the second display area A2) of the display 203 may be received into the inside of the second housing 202 (e.g., a slide-in motion) or be visually exposed to the outside of the second housing 202 (e.g., a slide-out motion) as the first housing 201 moves (e.g., slides) with respect to the second housing 202. According to an embodiment, a motor, a speaker, a sim socket, and/or a sub circuit board electrically connected with a main circuit board may be disposed in the first housing 201. A main circuit board on which electrical components, such as an application processor (AP) and a communication processor (CP) are mounted may be disposed in the second housing 202.

According to an embodiment, the first housing 201 may include a first plate 211 (e.g., a slide plate). According to an embodiment, the first plate 211 may support at least a portion of the display 203 (e.g., the first display area A1). According to an embodiment, the first plate 211 may include first sidewalls 211*a*, 211*b*, and 211*c* for surrounding at least a portion of the display 203 and/or the multi-bar structure (e.g., the multi-bar structure 213 of FIG. 4). According to an embodiment, the first sidewalls 211*a*, 211*b*, and 211*c* may extend from the first plate 211. The first sidewalls 211*a*, 211*b*, and 211*c* may include a 1-2th sidewall 211*b*, a 1-3th sidewall 211*c* opposite to the 1-2th sidewall 211*b*, and a 1-1th sidewall 211*a* extending from the 1-2th sidewall 211*b* to the 1-3th sidewall 211*c*. According to an embodiment, the 1-1th sidewall 211*a* may be substantially perpendicular to the 1-2th sidewall 211*b* and/or the 1-3th sidewall 211*c*. According to an embodiment, in the closed state (e.g., FIG. 2) of the electronic device 101, the 1-2th sidewall 211*b* may face the 2-2th sidewall 221*b* of the second housing 202, and the 1-3th sidewall 211*c* may face the 2-3th sidewall 221*c* of the second housing 202. According to an embodiment, the first plate 211, the 1-1th sidewall 211*a*, the 1-2th sidewall 211*b*, and/or the 1-3th sidewall 211*c* may be integrally formed. According to an embodiment, the first plate 211, the 1-1th sidewall 211*a*, the 1-2th sidewall 211*b*, and/or the 1-3th sidewall 211*c* may be formed as separate housings and be combined or assembled.

According to an embodiment, the second housing 202 may include second sidewalls 221*a*, 221*b*, and 221*c* to surround at least a portion of the first housing 201. According to an embodiment, the second sidewalls 221*a*, 221*b*, and 221*c* may extend from the second plate 221 and/or the cover member 222. According to an embodiment, the second sidewalls 221*a*, 221*b*, and 221*c* may include a 2-2th sidewall 221*b*, a 2-3th sidewall 221*c* opposite to the 2-2th sidewall 221*b*, and a 2-1th sidewall 221*a* extending from the 2-2th sidewall 221*b* to the 2-3th sidewall 221*c*. According to an embodiment, the 2-1th sidewall 221*a* may be substantially perpendicular to the 2-2th sidewall 221*b* and/or the 2-3th sidewall 221*c*. According to an embodiment, the 2-2th sidewall 221*b* may face the 1-2th sidewall 211*b*, and the 2-3th sidewall 221*c* may face the 1-3th sidewall 211*c*. For example, in the closed state (e.g., FIG. 2) of the electronic device 101, the 2-2th sidewall 221*b* may cover at least a portion of the 1-2th sidewall 211*b*, and the 2-3th sidewall 221*c* may cover at least a portion of the 1-3th sidewall 211*c*.

According to an embodiment, the second housing 202 may be formed to be open at one side (e.g., a front face) to receive (or surround) at least a portion of the second housing 201. For example, the first housing 201 may be connected to the second housing 202 while being at least partially surrounded by the 2-1th sidewall 221*a*, the 2-2th sidewall 221*b*, and the 2-3th sidewall 221*c* and may be slid in the direction of arrow 1 while being guided by the second housing 202. According to an embodiment, the cover member (e.g., the cover member 222 of FIG. 4), the 2-1th sidewall 221*a*, the 2-2th sidewall 221*b*, and/or the 2-3th sidewall 221*c* may be formed integrally. According to an embodiment, the second cover member 222, the 2-1th sidewall 221*a*, the 2-2th sidewall 221*b*, and/or the 2-3th sidewall 221*c* may be formed as separate housings and be combined or assembled.

According to an embodiment, the second housing 202 may include a rear plate 223. According to an embodiment, the rear plate 223 may form at least a portion of the exterior of the electronic device 101. For example, the rear plate 223 may provide a decorative effect on the exterior of the electronic device 101.

According to an embodiment, the cover member 222 and/or the 2-1th sidewall 221*a* may cover at least a portion of the display 203. For example, at least a portion of the display 203 (e.g., the second display area A2) may be received in the second housing 202, and the cover member 222 and/or the 2-1th side wall 221*a* may cover a portion of the display 203 received in the second housing 202.

According to an embodiment, the electronic device 101 may include a display 203. For example, the display 203 may be interpreted as a flexible display or a rollable display. According to an embodiment, at least a portion of the display 203 (e.g., the second display area A2) may slide based on the sliding movement of the first housing 201. According to an embodiment, the display 203 may include, or be disposed adjacent to, a touch detection circuit, a pressure sensor capable of measuring the intensity (pressure) of a touch, and/or a digitizer that detects a magnetic field-type stylus pen. The configuration of the display 203 of FIGS. 2 and 3 may be identical in whole or part to the configuration of the display module 160 of FIG. 1.

According to various embodiments, the display 203 may include a first display area A1 and a second display area A2. According to an embodiment, the first display area A1 may be an area that is always visible from the outside. According to an embodiment, the first display area A1 may be interpreted as an area that cannot be positioned inside the housing 202. According to an embodiment, the second display area A2 may extend from the first display area A1, and the second display area A2 may be inserted or received in, or visually exposed to the outside of, the second housing 202 as the first housing 201 slides. According to an embodiment, the first display area A1 may be seated on a portion (e.g., the first plate 211) of the first housing 201.

According to an embodiment, the second display area A2 may be substantially moved while being guided by the multi-bar structure (e.g., the multi-bar structure 213 of FIG. 4) mounted in the first housing 201 and may be thus received in, or visually exposed to the outside of, the second housing 202 or a space formed between the first housing 201 and the second housing 202. According to an embodiment, the second display area A2 may be moved based on the sliding movement of the first housing 201 in the width direction (e.g., the direction indicated by the arrow ①). For example, at least a portion of the second display area A2 may be unfolded or rolled together with the multi-bar structure 213 based on a slide of the first housing 201.

According to various embodiments, when viewed from above the first housing 201, if the first housing 201 moves from the closed state to the open state, the second display area A2 may be gradually exposed to the outside of the housing 202 to be substantially coplanar with the first display area A1. In an embodiment, the second display area A2 may be at least partially received in the first housing 201 and/or the second housing 202.

According to various embodiments, the electronic device 101 may include at least one key input device 241, a connector hole 243, audio modules 247*a* and 247*b*, or camera modules 249*a* and 249*b*. Although not shown, the electronic device 101 may further include an indicator (e.g., a light emitting diode (LED) device) or various sensor modules. The configuration of the audio module 247*a* and 247*b* and camera modules 249*a* and 249*b* of FIGS. 2 and 3 may be identical in whole or part to the configuration of the audio module 170 and the camera module 180 of FIG. 1.

According to an embodiment, the key input device 241 may be positioned in one area of the first housing 201. Depending on the appearance and the state of use, the electronic device 101 may be designed to omit the illustrated key input device 241 or to include additional key input device(s). According to an embodiment, the electronic device 101 may include a key input device (not shown), e.g., a home key button or a touchpad disposed around the home key button. According to an embodiment (not shown), at least a portion of the key input device 241 may be disposed on the second housing 202.

According to various embodiments, the connector hole 243 may be omitted or may receive a connector (e.g., a universal serial bus (USB) connector) for transmitting and receiving power and/or data with an external electronic device. Although not shown, the electronic device 101 may include a plurality of connector holes 243, and some of the plurality of connector holes 243 may function as connector holes for transmitting/receiving audio signals with an external electronic device. In the illustrated embodiment, the connector hole 243 is disposed in the 2-3th sidewall 123*c*, but the present disclosure is not limited thereto. The connector hole 243 or a connector hole not shown may be disposed in the 2-1th sidewall 221*a* or the 2-2th sidewall 221*b*.

According to various embodiments, the audio modules 247*a* and 247*b* may include at least one speaker hole 247*a* and 247*b* or at least one microphone hole. At least one of the speaker holes 247*a* and 247*b* may be provided as an external speaker hole. At least one of the speaker holes 247*a* and 247*b* may be provided as a receiver hole for voice call. The electronic device 101 may include a microphone for obtaining sound. The microphone may obtain external sound of the electronic device 100 through the microphone hole. According to an embodiment, the electronic device 101 may include a plurality of microphones to detect the direction of sound. According to an embodiment, the electronic device 101 may include an audio module in which the speaker holes 247*a* and 247*b* and the microphone hole are implemented as one hole or may include a speaker without the speaker hole 247*a* (e.g., a piezo speaker).

According to an embodiment, the camera modules 249*a* and 249*b* may include a first camera module 249*a* and/or a second camera module 249*b*. The second camera module 249*b* may be positioned in the second housing 202 and may capture a subject in a direction opposite to the first display area A1 of the display 203. The electronic device 101 may include a plurality of camera modules 249*a* and 249*b*. For example, the electronic device 101 may include at least one of a wide-angle camera, a telephoto camera, or a close-up camera. According to an embodiment, the electronic device 200 may measure the distance to the subject by including an infrared projector and/or an infrared receiver. The camera modules 249*a* and 249*b* may include one or more lenses, an image sensor, and/or an image signal processor. The electronic device 101 may further include another camera module (first camera module 249*a*, e.g., a front camera) that captures a subject in a direction opposite to the second camera module 249*b*. For example, the first camera module 249*a* may be disposed around the first display area A1 or in an area overlapping the first display area A1. If disposed in an area overlapping the display 203, the first camera module 249*a* may capture the subject through the display 203.

According to various embodiments, an indicator (e.g., an LED device) of the electronic device 101 may be disposed on the first housing 201 and/or the second housing 202, and the indicator may include a light emitting diode to provide state information about the electronic device 101 as a visual signal. The sensor module (e.g., the sensor module 176 of FIG. 1) of the electronic device 101 may produce an electrical signal or data value corresponding to the internal operation state or external environment state of the electronic device. The sensor module may include, for example, a proximity sensor, a fingerprint sensor, or a biometric sensor (e.g., an iris/face recognition sensor or a heartrate monitor (HRM) sensor). In an embodiment, the electronic device 101 may include at least one of a gesture sensor, a gyro sensor, an atmospheric pressure sensor, a magnetic sensor, an accelerometer, a grip sensor, a color sensor, an infrared (IR) sensor, a temperature sensor, a humidity sensor, or an illuminance sensor. The configuration of the display 203, audio module 247a and 247b, and camera module 249a and 249b of FIGS. 2A and 2B may be identical in whole or part to the configuration of the display module 160, the audio module 170, and the camera module 180 of FIG. 1.

Figure 4:
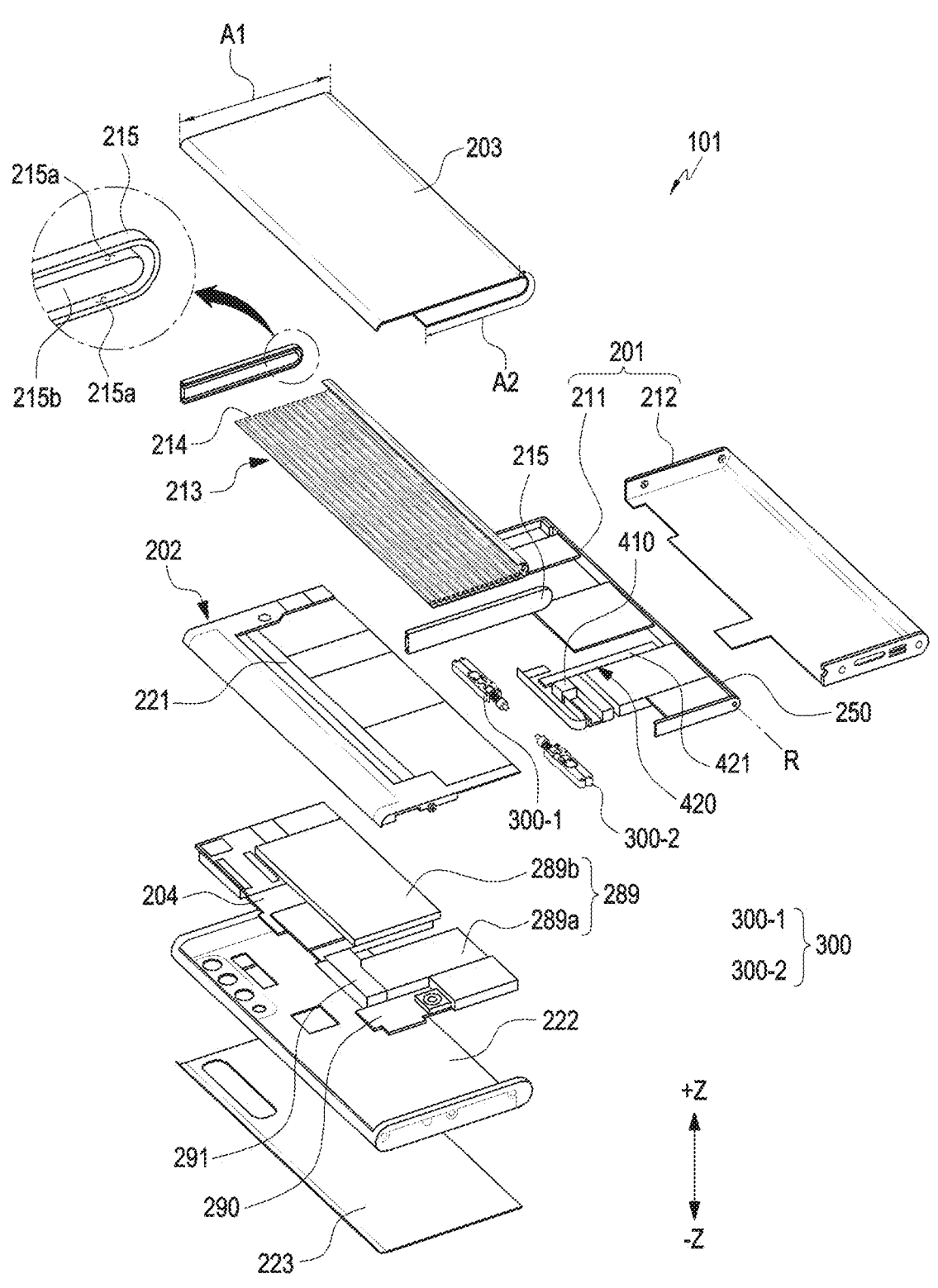
FIG. 4 is an exploded perspective view illustrating an electronic device according to various embodiments.
Figure 5:
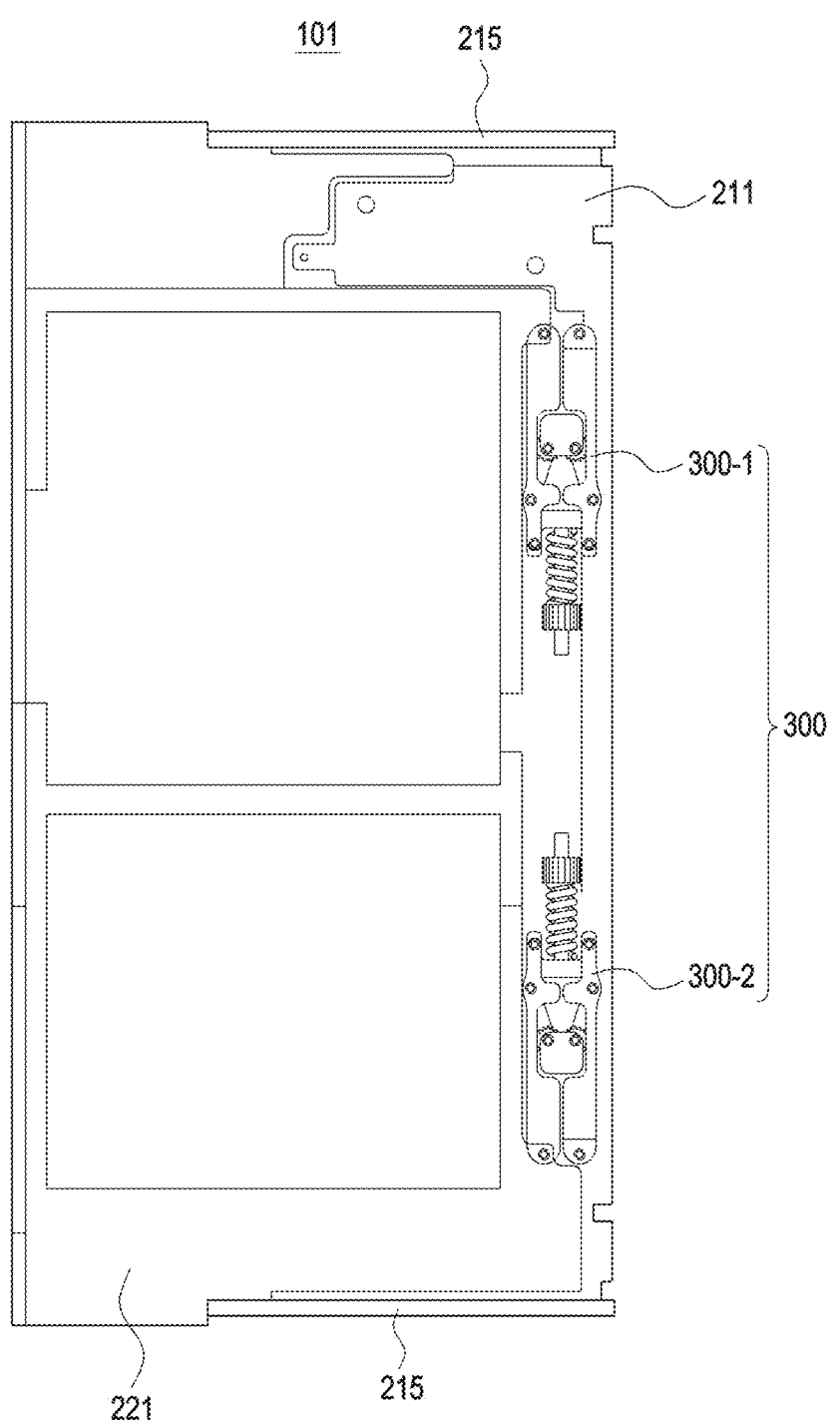
FIG. 5 is a diagram illustrating front view of an electronic device through which a display is shown, according to various embodiments.

FIG. 4 is an exploded perspective view illustrating an electronic device according to various embodiments. FIG. 5 is a diagram illustrating a front view of an electronic device through which a display is shown, according to various embodiments.

Referring to FIGS. 4 and 5, an electronic device 101 may include a first housing 201, a second housing 202, a display 203, and a multi-bar structure 213. A portion (e.g., the second display area A2) of the display 203 may be received in the electronic device 101 while being guided by the multi-bar structure 213. The configuration of the first housing 201, the second housing 202, and the display 203 of FIG. 4 may be identical in whole or part to the configuration of the first housing 201, the second housing 202, and the display 203 of FIGS. 2 and/or 3.

According to an embodiment, the first housing 201 may include a first plate 211 and a slide cover 212. The first plate 211 and the slide cover 212 may linearly reciprocate in one direction (e.g., the direction of arrow ① in FIG. 1) while being guided by the second housing 202. According to an embodiment, the first plate 211, along with the slide cover 212, may slide with respect to the second housing 202. For example, at least a portion of the display 203 and/or at least a portion of the multi-bar structure 213 may be disposed between the first plate 211 and the slide cover 212.

According to an embodiment, the first plate 211 may support at least a portion of the display 203 (e.g., the second display area A2). For example, the first plate 211 may include a curved surface 250. The second display area A2 of the display 203 may be positioned on the curved surface 250. According to an embodiment, the first plate 211 may be interpreted as a display support bar (DSB).

According to an embodiment, the slide cover 212 may protect the display 203 positioned on the first plate 211. For example, at least a portion of the display 203 may be positioned between the first plate 211 and the slide cover 212. According to an embodiment, the first plate 211 and the slide cover 212 may be formed of a metal material and/or a non-metal (e.g., polymer) material.

According to an embodiment, the first housing 201 may include a guide rail 215. According to an embodiment, the guide rail 215 may be connected to the first plate 211 and/or the slide cover 212. For example, the guide rail 215, along with the first plate 211 and the second slide cover 212, may slide with respect to the second housing 202.

According to an embodiment, the electronic device 101 may include a multi-bar structure 213. According to an embodiment, the multi-bar structure 213 may support the display 203. For example, the multi-bar structure 213 may be connected with the display 203. According to an embodiment, at least a portion of the display 203 and the multi-bar structure 213 may be positioned between the first plate 211 and the slide cover 212. According to an embodiment, as the first housing 201 slides, the multi-bar structure 213 may move with respect to the second housing 202. In the closed state (e.g., FIG. 2A) of the multi-bar structure 213, most of the structure may be received in the second housing 202.

According to an embodiment, at least a portion of the multi-bar structure 213 may move corresponding to the curved surface 250 positioned at the edge of the first plate 211.

According to an embodiment, the multi-bar structure 213 may include a plurality of bars 214 (or rods). The plurality of rods 214 may extend in a straight line and be disposed parallel to the rotational axis R formed by the curved surface 250, and the plurality of rods 214 may be arranged along a direction perpendicular to the rotational axis R (e.g., the direction along which the first housing 201 slides).

According to an embodiment, each rod 214 may pivot around another adjacent rod 214 while remaining parallel with the other adjacent rod 214. According to an embodiment, as the first housing 201 slides, the plurality of rods 214 may be arranged to form a curved shape or may be arranged to form a planar shape. For example, as the first housing 201 slides, a portion of the multi-bar structure 213 facing the curved surface 250 may form a curved surface, and another portion of the multi-bar structure 213 that does not face the curved surface 250 may form a flat surface. According to an embodiment, the second display area A2 of the display 203 may be mounted or supported on the multi-bar structure 213, and in the open state (e.g., FIG. 2B), at least a portion of the second display area A2, along with the first display area A1, may be exposed to the outside of the second housing 202. In the state in which the second display area A2 is visually exposed to the outside of the second housing 202, the multi-bar structure 213 may substantially form a flat surface, thereby supporting or maintaining the second display area A2 in the flat state. According to an embodiment, the multi-bar structure 213 may be replaced with a bendable integral supporting member (not shown). According to an embodiment, the multi-bar structure 213 may be interpreted as a display supporting multi-bar or articulated hinge structure. According to an embodiment, the guide rail 215 may guide the movement of the plurality of rods 214. According to an embodiment, the guide rail 215 may include an upper guide rail adjacent to the 1-2th sidewall (e.g., the 1-2th sidewall 211b in FIG. 3) and a lower guide rail adjacent to the 1-3th sidewall (e.g., the 1-3th sidewall 211c). According to an embodiment, the guide rail 215 may include a groove-shaped rail 215a formed inside the guide rail 215 and a protrusion 215b positioned inside the guide rail. At least a portion of the protrusion 215b may be surrounded by the rail 415a. According to an embodiment, the multi-bar structure 213 may be positioned between the upper guide rail and the lower guide rail and may move while remaining engaged with the upper and lower guide rails. For example, upper and/or lower portions of the plurality of rods 214 may slide along the rail 215a while fitted into the rail 215a. According to an embodiment, the first plate 211 may provide pressure to the display 203. For example, the first plate 211 may be connected to the guide rail 215, and when the first plate 211 slides, the guide rail 215 may transfer pressure to the multi-bar structure 213 using the rail 215a and/or the protrusion 215b. The display 203 may be connected to the multi-bar structure 213. When the first plate 211 slides, the force and/or pressure due to the slide of the first plate 211 may be transferred to the display 203 through the guide rail 215 and the multi-bar structure 213.

According to an embodiment, when the electronic device 101 is opened (e.g., a slide-out motion), the size of the area where the display 203 is visually exposed to the outside may be increased. For example, by driving the motor structure (e.g., the motor structure 410 of FIG. 4) (e.g., driving for sliding out the display) and/or by an external force provided by the user, the first plate 211 connected with the motor structure 410 may be slid out, and the protrusion 215*b* inside the guide rail 215 may push out the upper and/or lower ends of the plurality of rods 214. Accordingly, the display 203 received between the first plate 211 and the slide cover 212 may be extended to the front.

According to an embodiment, when the electronic device 101 is closed (e.g., a slide-in motion), the size of the area where the display 203 is visually exposed to the outside may be reduced. For example, by driving the motor (e.g., the motor structure 410 of FIG. 4) (e.g., driving for sliding in the display) and/or by an external force provided by the user, the first plate 211 where the motor is disposed may be slid in, and the outer portion (e.g., a portion other than the protrusion 215*b*) of the guide rail 215 may push out the upper and/or lower ends of the plurality of rods 214. Accordingly, the extended display 203 may be received between the first plate 211 and the slide cover 212.

According to an embodiment, the second housing 202 may include a second plate 221, a cover member 222, and a rear plate 223. According to an embodiment, the second plate 221 may support at least a portion (e.g., the first display area A1) of the display 203. The first plate 211 may be disposed between the display 203 and the circuit board 204. According to an embodiment, the cover member 222 may receive components (e.g., the battery 289 (e.g., the battery 189 of FIG. 1) and the circuit board 204) of the electronic device 101 and may protect the components of the electronic device 101. According to an embodiment, the cover member 222 may be referred to as a book cover.

According to various embodiments, a plurality of circuit boards may be received in the second housing 202. A processor, memory, and/or interface may be mounted on the circuit board 204 which is the main board. The processor may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/ disclosed functions, e.g., in a distributed manner. At least one processor may execute program instructions to achieve or perform various functions, and may include one or more of, e.g., a central processing unit, an application processor, a graphic processing device, an image signal processing, a sensor hub processor, or a communication processor. According to various embodiments, the circuit board 204 may include a flexible printed circuit board type radio frequency cable (FRC). For example, the circuit board 204 may be disposed in the cover member 222 and may be electrically connected with an antenna module (e.g., the antenna module 197 of FIG. 1) and a communication module (e.g., the communication module 190 of FIG. 1).

According to an embodiment, the memory may include, e.g., a volatile or non-volatile memory.

According to an embodiment, the interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to various embodiments, the electronic device 101 may further include a separate sub circuit board 290 spaced apart from the circuit board 240 in the second housing 202. The sub circuit board 290 may be electrically connected with the circuit board 240 through the flexible circuit board 291. The sub circuit board 290 may be electrically connected with electrical components disposed in an end of the electronic device 101, such as the battery 289 or a speaker and/or a sim socket, and may transfer signals and power.

According to an embodiment, the battery 289 may be a device for supplying power to at least one component of the electronic device 101. The battery 189 may include, e.g., a primary cell which is not rechargeable, a secondary cell which is rechargeable, or a fuel cell. At least a portion of the battery 289 may be disposed on substantially the same plane as the circuit board 204. The battery 289 may be integrally or detachably disposed inside the electronic device 101.

According to an embodiment, the battery 289 may be formed as a single embedded battery or may include a plurality of removable batteries (e.g., the first battery 289*a* and the second battery 289*b*). According to an embodiment, when the embedded battery is positioned on the first plate 211, the embedded battery may move as the first plate 211 slides. According to an embodiment, when the embedded battery is positioned on the second plate 221, the embedded battery may be fixedly disposed on the second plate 221, regardless of the slide of the first plate 211. As another example, when the first battery 289*a* of the removable batteries is positioned on the first plate 211, and the second battery 289*b* of the removable batteries is fixedly positioned on the second plate 221, only the first battery 289*a* may move as the first plate 211 slides.

According to various embodiments, the rear plate 223 may substantially form at least a portion of the exterior of the second housing 202 or the electronic device 101. For example, the rear plate 223 may be coupled to the outer surface of the cover member 222. According to an embodiment, the rear plate 223 may be integrally formed with the cover member 222. According to an embodiment, the rear plate 223 may provide a decorative effect on the exterior of the electronic device 101. The second plate 221 and the cover member 222 may be formed of at least one of a metal or a polymer, and the rear plate 223 may be formed of at least one of metal, glass, synthetic resin or ceramic. According to an embodiment, the second plate 221, the cover member 222 and/or the rear plate 223 may be formed of a material that transmits light at least partially (e.g., the auxiliary display area). For example, in a state in which a portion of the display 203 (e.g., the second display area A2) is received in the electronic device 101, the electronic device 101 may output visual information using the second display area A2. The auxiliary display area may be a portion of the second plate 221, the cover member 222, and/or the rear plate 223 in which the display 203 received in the second housing 202 is positioned.

According to an embodiment, the electronic device 101 may include a driving element 300. According to an embodiment, the driving element 300 may reduce the force required to open the electronic device 101. When the display 203 is extended, the driving element 300 may provide a force (e.g., elastic force) to overcome at least a portion of the frictional force between the driving element 300 and components (e.g., the multi-bar structure 213 and/or guide rail 215) and/or repulsive force of the display 203. For example, as the driving element 300 provides a force in the opposite direction of the repulsive force generated when the display 203 is extended, the user convenience when the electronic device 101 is opened may be increased. For example, due to the elastic force provided by the driving element 300, the force required to open the electronic device 101 may be reduced. According to an embodiment, the driving element 300 may be interpreted as an actuator for generating at least a portion of the driving force for sliding the electronic device 101 or a hinge structure for guiding the slide of the electronic device 101.

According to an embodiment, the driving element 300 may be connected with the first housing (e.g., the first housing 201 of FIG. 3) and the second housing (e.g., the second housing 202 of FIG. 3). For example, the driving element 300 may be connected to the first plate 211 and the second plate 221. According to an embodiment, the first plate 211 may slide with respect to the second plate 221 using the driving element 300. For example, the driving element 300 may transfer the force (e.g., elastic force) in the second direction (e.g., Y-axis direction), in the first direction (e.g., X-axis direction). The driving element 300 may transfer the elastic force to the first plate 211 and/or the second plate 221 using the arm structure 310 provided from the elastic structure 320.

According to an embodiment, the electronic device 101 may include a motor structure 410 and a gear structure (e.g., the rack gear 421 and/or pinion gear (not shown)) configured to at least partially move based on the driving force generated from the motor structure 410. For example, the electronic device 101 may include a rack gear 421 connected to the first housing 201 (e.g., the first plate 211) and the motor structure 410 connected to the second housing 202 (e.g., the second plate 221) and a pinion gear configured to rotate based on the driving force generated from the motor structure 410. According to an embodiment, the driving element 300 may be operated independently of the motor structure 410. For example, the user may use either the driving element 300 or the motor structure 410 to open the electronic device 101.

According to an embodiment, the driving element 300 may provide a driving force for sliding the electronic device 101, along with the driving force generated from the motor structure 410. For example, the driving element 300 may function as a trigger device that provides a force for initial opening of the electronic device 101.

According to an embodiment, the driving element 300 may include a plurality of (e.g., two) driving elements. For example, the driving element 300 may include a first driving element 300-1 and a second driving element 300-2 positioned to be substantially symmetrical with the first driving element 300-1.

The electronic device 101 disclosed in FIGS. 2, 3 and 4 has a rollable or slidable appearance but the present disclosure is not limited thereto. According to an embodiment (not shown), at least a portion of the illustrated electronic device may be rolled up in a scroll shape.

Referring to FIGS. 2, 3 and 4, when viewed from the front of the electronic device 101, the display 203 may extend to the right of the electronic device 101. However, the structure of the electronic device 101 is not limited thereto. For example, according to an embodiment, the display 203 may extend to the left of the electronic device 101.

Figure 6:
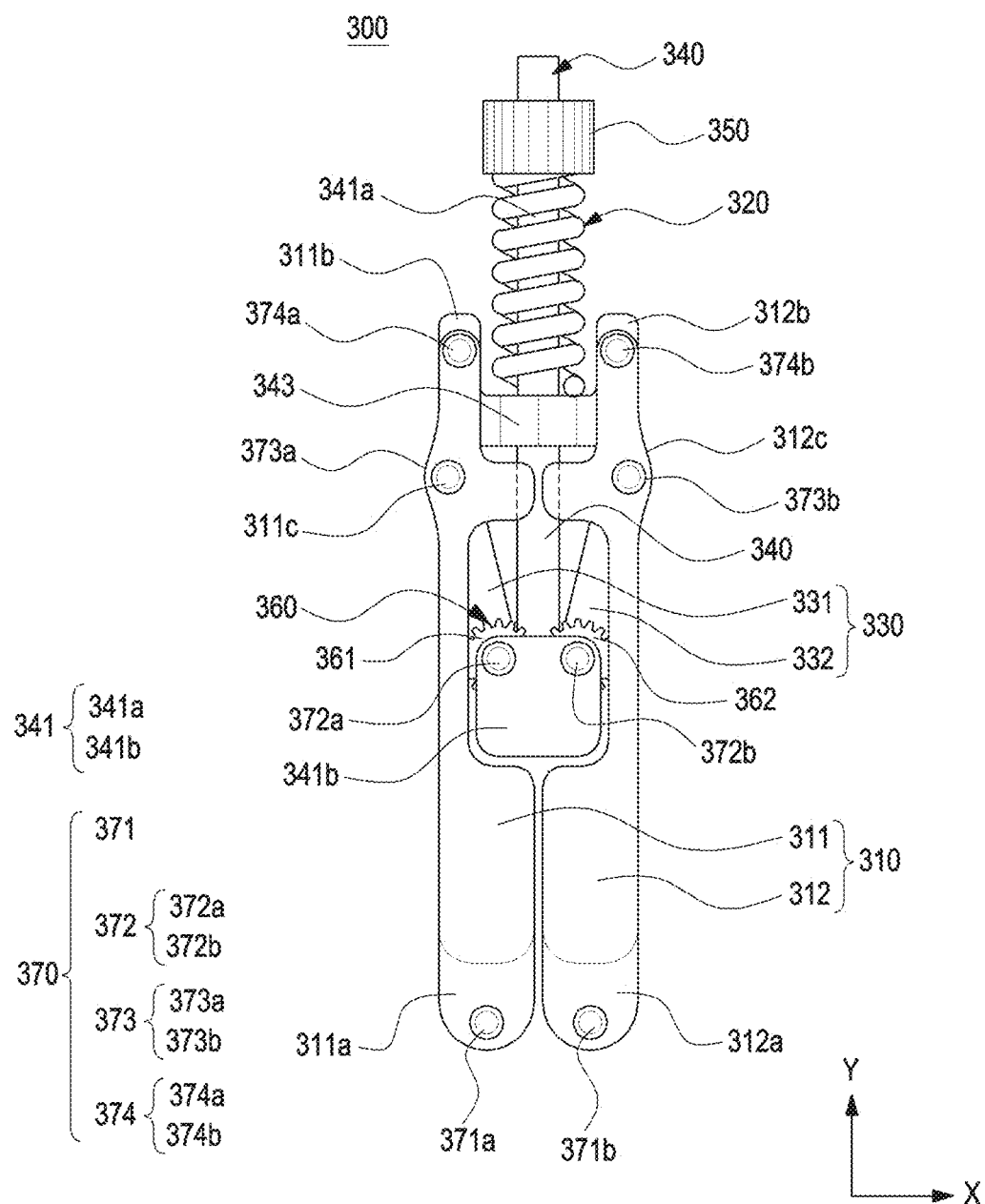
FIG. 6 is a diagram illustrating a front view of a driving element in a closed state according to various embodiments.
Figure 7:
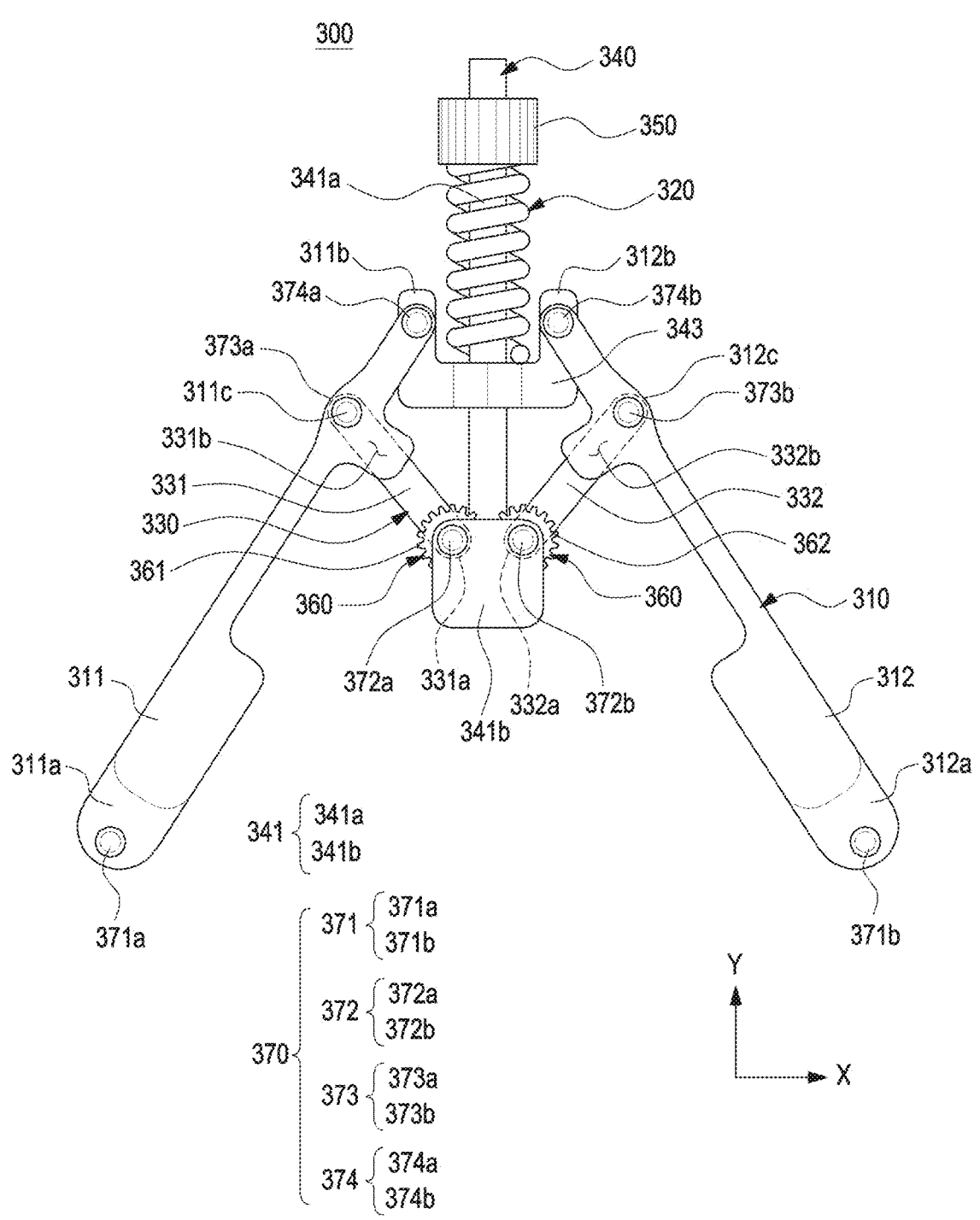
FIG. 7 is a diagram illustrating a front view of a driving element in an open state according to various embodiments.

FIG. 6 is a diagram illustrating a front view of a driving element in a closed state according to various embodiments. FIG. 7 is a diagram illustrating front view of a driving element in an open state according to various embodiments.

Referring to FIGS. 6 and 7, the driving element 300 may include an arm structure 310, an elastic structure 320, a link structure 330, a shaft structure 340, a fastening structure 350, an interlocking structure 360, and/or a pin structure 370.

According to an embodiment, the arm structure 310 may transfer a force to a first housing (e.g., the first housing 201 of FIG. 4) and/or a second housing (e.g., the second housing 202 of FIG. 4). For example, the arm structure 310 may be connected to the first plate 211 and the second plate 221 and may be changed to a closed first state (e.g., FIG. 6) or an unfolded second state (e.g., FIG. 7). The electronic device 101 may be opened or closed based on the state of the arm structure 310.

According to an embodiment, the arm structure 310 may include a first arm member 311 connected to the first housing 201 and a second arm member 312 connected to the second housing 202. According to an embodiment, the first arm member 311 may include a first end portion 311a adjacent to the first plate 211 and a second end portion 311b opposite to the first end portion 311a. The second arm member 312 may include a third end portion 312a adjacent to the second plate 221 and a fourth end portion 312b opposite to the third end portion 312a. According to an embodiment, the first arm member 311 and the second arm member 312 may be interpreted as bars or rods.

According to an embodiment, the first arm member 311 may be rotatably connected to the first plate 211, and the second arm member 312 may be rotatably connected to the second plate 221. According to an embodiment, the first end portion 311a of the first arm member 311 may be rotatably connected to the first plate 211 using a 1-1th pin 371a, and the fourth end portion 312b of the second arm member 312 may be rotatably connected to the second plate 221 using a 1-2th pin 371b. For example, the first arm member 311 may rotate with respect to the first plate 211 about the 1-1th pin 371a, and the second arm member 312 may rotate with respect to the second plate 221 about the 1-2th pin 371b.

According to an embodiment, the first arm member 311 and/or the second arm member 312 may be rotatably connected to the shaft structure 340. According to an embodiment, the second end portion 311b of the first arm member 311 may be rotatably connected to the shaft structure 340 using a 4-1th pin 374a, and the fourth end portion 312b of the second arm member 312 may be rotatably connected to the shaft structure 340 using a 4-2th pin 374b. For example, the first arm member 311 may rotate with respect to the shaft structure 340 about the 4-1th pin 374a, and the second arm member 312 may rotate with respect to the shaft structure 340 about the 4-2th pin 374b.

According to an embodiment, the elastic structure 320 may provide an elastic force for the slide of the electronic device 101. According to an embodiment, the elastic structure 320 may be connected to at least a portion (e.g., the slide part 343) of the shaft structure 340 and may provide an elastic force to the slide part 343. According to an embodiment, the elastic structure 320 may be compressed or extended in a second direction (e.g., the Y-axis direction) substantially perpendicular to the first direction (e.g., the X-axis direction) in which the electronic device 101 slides. According to an embodiment, the elastic structure 320 may include a coil spring surrounding at least a portion (e.g., the shaft 341) of the shaft structure 340.

According to an embodiment, the link structure 330 may be connected to the shaft structure 340 and the arm structure 310. According to an embodiment, the link structure 330 may include a first link member 331 connected to the first arm member 311 and the shaft structure 340 and a second link member 332 connected to the second arm member 312 and the shaft structure 340. According to an embodiment, the link structure 330 may convert an elastic force provided from the elastic structure 320 into a force for sliding the housings 201 and 202.

According to an embodiment, the first link member 331 may include a fifth end portion 331a connected to a portion (e.g., the shaft 341) of the shaft structure 340 and a sixth end portion 331b opposite to the fifth end portion 331a and connected to the first arm member 311. According to an embodiment, the second link member 332 may include a seventh end portion 332a connected to a portion (e.g., the shaft 341) of the shaft structure 340 and an eighth end portion 332b opposite to the seventh end portion 332a and connected to the second arm member 312. According to an embodiment, the first link member 331 and the second link member 332 may be interpreted as bars or rods.

According to an embodiment, the fifth end portion 331a of the first link member 331 may be rotatably connected to the second shaft area 341b using a 2-1th pin 372a, and the sixth end portion 331b of the first link member 331 may be rotatably connected to the first connection area 311c of the first arm member 311 using a 3-1th pin 373a. The first connection area 311c may be interpreted as a portion of the first arm member 311 positioned between the first end portion 311a and the second end portion 311b of the first arm member 311. According to an embodiment, the first link member 331 may rotated about the 2-1th pin 372a and/or the 3-1th pin 373a.

According to an embodiment, the seventh end portion 332a of the second link member 332 may be rotatably connected to the second shaft area 341b using a 2-2th pin 372b, and the eighth end portion 332b of the second link member 332 may be rotatably connected to the second connection area 312c of the second arm member 312 using a 3-2th pin 373b. The second connection area 312c may be interpreted as a portion of the second arm member 312 positioned between the third end portion 312a and the fourth end portion 312b of the second arm member 312. According to an embodiment, the second link member 332 may rotated about the 2-2th pin 372b and/or the 3-2th pin 373b.

According to an embodiment, the shaft structure 340 may receive the arm structure 310, the elastic structure 320, and/or the link structure 330.

According to an embodiment, the shaft structure 340 may include a shaft 341 extending in the second direction (Y-axis direction). The shaft structure 340 may include a first shaft area 341a at least partially surrounded by the elastic structure 320 and a second shaft area 341b extending from the first shaft area 341a and connected to the first link member 331 and the second link member 332. According to an embodiment, the first shaft area 341a may be connected to the fastening structure 350. According to an embodiment, the second shaft area 341b may receive the second pin 372, and the first link member 331 and the second link member 332 connected to the second pin 372 may rotate about the second shaft area 341b.

According to an embodiment, the shaft structure 340 may include a slide part 343 connected to the elastic structure 320. According to an embodiment, the slide part 343 may be connected to the arm structure 310. For example, the slide part 343 may be connected to the second end portion 311b of the first arm member 311 using a 4-1th pin 374a, and may be connected to the fourth end portion 312b of the second arm member 312 using a 4-2th pin 374b.

According to an embodiment, the slide part 343 may slide in the second direction (Y-axis direction) based on the elastic force provided by the elastic structure 320. For example, the slide part 343 may slide along the first shaft area 341a, and the distance between a portion (e.g., the second shaft area 341b) of the shaft 341 and the slide part 343 may be changed based on the open state of the electronic device (e.g., the electronic device 101 of FIG. 3). For example, in the closed state (e.g., FIG. 2 or FIG. 6) of the electronic device 101, the distance between the slide part 343 and the second shaft area 341b may be longer than the distance between the slide part 343 and the second shaft area 341b in the open state (e.g., FIG. 3 or FIG. 7) of the electronic device 101.

According to an embodiment, the fastening structure 350 may adjust the elastic force of the elastic structure 320. For example, the fastening structure 350 may be coupled to a portion (e.g., the first shaft area 341a) of the shaft structure 340. According to an embodiment, the fastening structure 350 may be coupled to a groove (e.g., a thread, a recess, and/or a through hole) or a protrusion formed in the shaft 341.

According to an embodiment, one end portion of the elastic structure 320 may be connected to the fastening structure 350, and the other end portion of the fastening structure 350 may provide pressure to the slide part 343. The length of the elastic structure 320 may be changed based on the position where the fastening structure 350 is coupled to the first shaft area 341a. For example, as the fastening structure 350 is connected or fastened to the shaft 341 adjacent to the slide part 343, the magnitude of the elastic force provided by the elastic structure 320 to the slide part 343 may increase. According to an embodiment, the fastening structure 350 may be referred to as a force dial. According to an embodiment, in the manufacturing process of the electronic device 101 or the driving element 300, the position where the fastening structure 350 is fastened to the shaft 341 may be selectively determined based on the design of the electronic device 101 (e.g., the size of the display 203). For example, the length of the elastic structure 320 may be adjusted by the fastening structure 350.

According to an embodiment, the interlocking structure 360 may interlock the movements of the arm structure 310 and/or the link structure 330 to each other. According to an embodiment, the interlocking structure 360 may include a first gear 361 connected to the first link member 331 and a second gear 362 connected to the second link member 332 and engaged with the first gear 361. For example, the first link member 331 may rotate at the same angle as the angle at which the second link member 332 rotates using the first gear 361 and the second gear 362. As the first link member 331 and the second link member 332 rotate by the same angle, the angle at which the first arm member 311 rotates may be set to be the same as the angle at which the second arm member 312 rotates. According to an embodiment (not shown), the interlocking structure 360 may include a plurality of gears positioned between the first gear 361 and the second gear 362.

According to an embodiment, the pin structure 370 may rotatably connect or couple the components of the driving element 300.

According to an embodiment, the pin structure 370 may include a first pin 371 for rotatably connecting the housing (e.g., the housing 200 of FIG. 3) and the arm structure 310. For example, the first pin 371 may include a 1-1th pin 371a connecting the first arm member 311 and the first plate (e.g., the first plate 211 of FIG. 5) and a 1-2th pin 371b connecting the second arm member 312 and the second plate (e.g., the second plate 221 of FIG. 5).

According to an embodiment, the pin structure 370 may include a second pin 372 for rotatably connecting the link structure 330 and the shaft structure 340. For example, the second pin 372 may include a 2-1th pin 372a connecting the first link member 331 and the second shaft area 341b and a 2-2th pin 372b connecting the second link member 332 and the second shaft area 341b.

According to an embodiment, the pin structure 370 may include a third pin 373 for rotatably connecting the arm structure 310 and the link structure 330. For example, the third pin 373 may include a 3-1th pin 373a connecting the first arm member 311 and the first link member 331 and a 3-2th pin 373b connecting the second arm member 312 and the second link member 332.

According to an embodiment, the pin structure 370 may include a fourth pin 374 for rotatably connecting the arm structure 310 and the shaft structure 340. For example, the fourth pin 374 may include a 4-1th pin 374a connecting the first arm member 311 and the slide part 343 and a 4-2th pin 374b connecting the second arm member 312 and the slide part 343.

Figure 8:
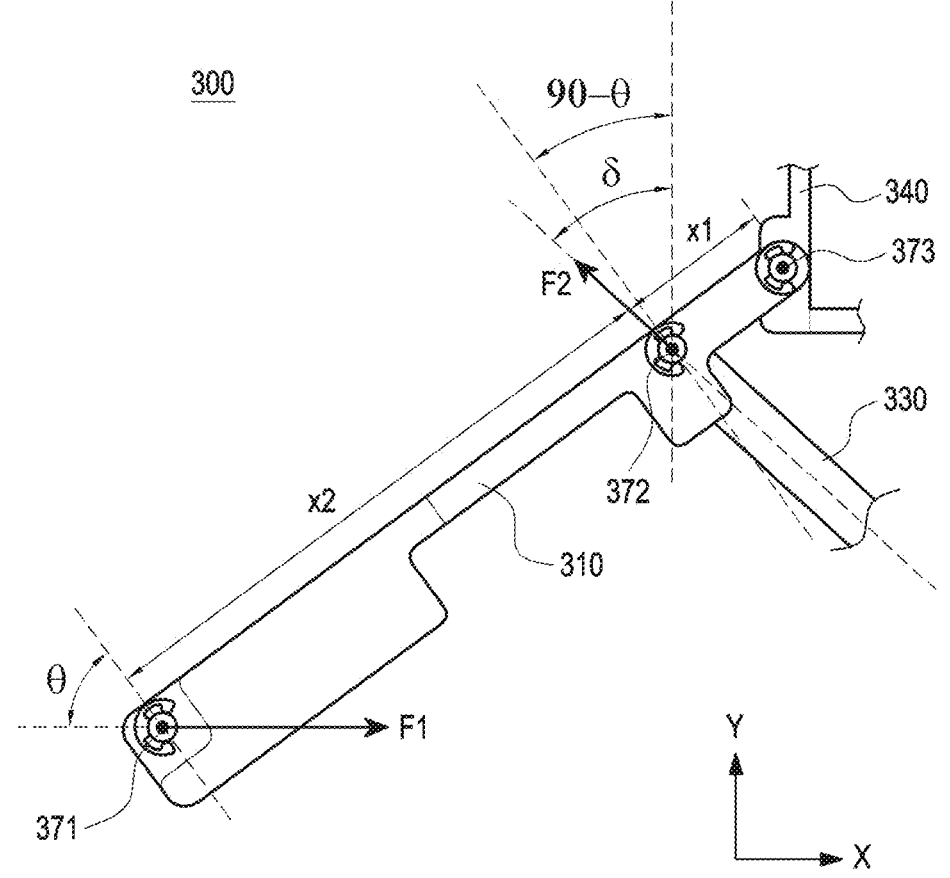
FIG. 8 is a diagram illustrating a driving force of a driving element according to various embodiments.

FIG. 8 is a diagram illustrating a driving force of a driving element according to various embodiments.

Referring to FIG. 8, a driving element 300 may include an arm structure 310, a link structure 330, a shaft structure 340, a first pin 371, a third pin 373, and a fourth pin 374. The configuration of the arm structure 310, the link structure 330, the shaft structure 340, the first pin 371, the third pin 373, and the fourth pin 374 of FIG. 8 may be identical in whole or part to the configuration of the arm structure 310, the link structure 330, the shaft structure 340, the first pin 371, the third pin 373, and the fourth pin 374 of FIGS. 6 and 7.

According to an embodiment, the driving element 300 may provide or receive a force (e.g., the first force F1) to a housing (e.g., the first housing 201 or the second housing 202 of FIG. 3). For example, the elastic force Fs provided from the elastic structure (e.g., the elastic structure 320 of FIG. 6) may be transferred to the shaft structure 340, and at least a portion of the elastic force Fs transferred to the shaft structure 340 may be transferred to the housing (e.g., the first housing 201 or the second housing 202 of FIG. 3) using the arm structure 310 and/or the link structure 330, as a first force F1.

According to an embodiment, the elastic force Fs generated by the compression of the elastic structure 320 may be transferred to the shaft structure 340, and a second force F2 in the direction in which the link structure 330 extends may meet Equation 1 below. The first angle δ below may be an angle between the link structure 330 and the elastic structure 320. For example, the first angle δ may be interpreted as an angle between a second direction (Y-axis direction) perpendicular to the first direction (X-axis direction) in which the electronic device (e.g., the electronic device 101 of FIG. 3) slides and a direction in which the link structure 330 extends. Equation 1 below refers to the sum relationship between the elastic force Fs and the second force F2 in the direction in which the link structure 330 extends.

$$Fs - 2F2 \cdot \cos\delta \qquad \text{[Equation 1]}$$

According to an embodiment, the force Fp2 applied to the arm structure 310 at the point where the second pin 372 is placed may meet Equation 2 below. θ below may be an angle between a direction in which the arm structure 310 is perpendicular and a moving direction (X-axis direction) of the housing (e.g., the housing 200 of FIG. 3).

$$Fp2 - F2 \cdot \cos[\delta - (90 - 0)] - \frac{1}{2}Fs\frac{(\cos[\delta - (90 - \delta)])}{\cos\delta} \qquad \text{[Equation 2]}$$

According to an embodiment, the relationship between the torque at the point where the first pin 371 is positioned and the torque at the point where the second pin 372 is positioned may meet the relationship of Equation 3 below.

In Equation 3, the first distance x1 may be a distance between the third pin 373 and the fourth pin 374, and the second distance x2 may be a distance between the third pin 373 and the first pin 371. According to an embodiment, the magnitude of the first force F1 transferred to the housing 200 may be changed based on the magnitude of the elastic force Fs, the length of the arm structure 310 (e.g., the first distance x1 and/or the second distance x2), and/or the angle at which the arm structure 310 is positioned. According to an embodiment, the magnitude of the first force F1 may be set to be greater than the sum of the repulsive force of the display (e.g., the display 203 of FIG. 3) and/or the frictional force of the components of the electronic device (e.g., the electronic device 101 of FIG. 3).

$$F1 = Fp2 \cdot \frac{1}{\cos\theta} \cdot \frac{x1}{x1 + x2} = \frac{Fs}{2} \cdot \frac{(\cos[\delta - (90 - \delta)]}{\cos\delta} \cdot \frac{x1}{x1 + x2} \qquad \text{[Equation 3]}$$

Figure 9:
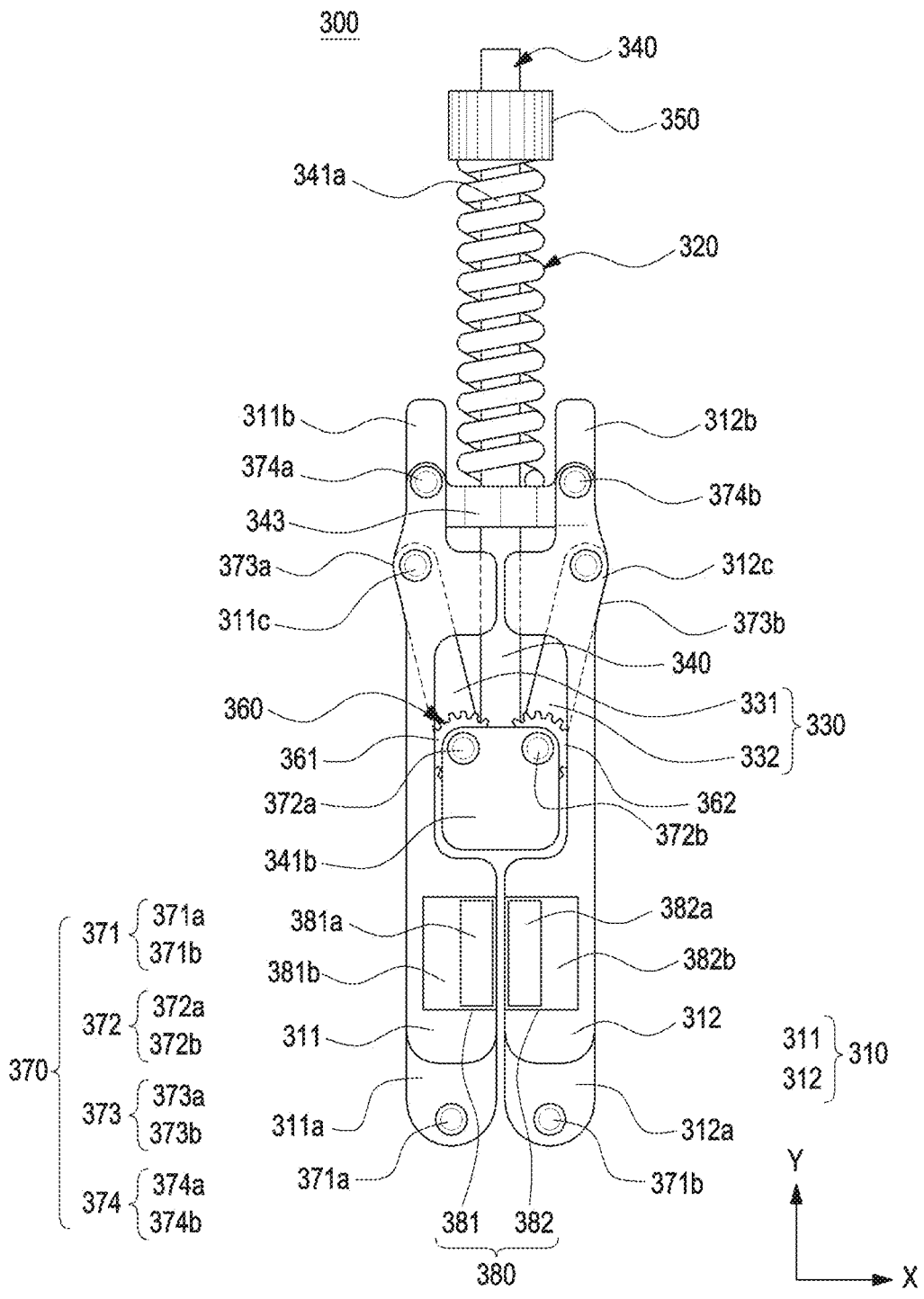
FIG. 9 is a diagram illustrating a front view of a driving element including a magnetic body according to various embodiments.

FIG. 9 is a diagram illustrating a front view of a driving element including a magnetic body according to various embodiments.

Referring to FIG. 9, a driving element 300 may include an arm structure 310, an elastic structure 320, a link structure 330, a shaft structure 340, a fastening structure 350, an interlocking structure 360, a pin structure 370, and/or a magnetic structure 380. The configuration of the arm structure 310, the elastic structure 320, the link structure 330, the shaft structure 340, the fastening structure 350, the interlocking structure 360, and/or the pin structure 370 of FIG. 9 may be identical in whole or part to the configuration of the arm structure 310, the elastic structure 320, the link structure 330, the shaft structure 340, the fastening structure 350, the interlocking structure 360, and the pin structure 370 of FIGS. 6 and 7.

According to an embodiment, the magnetic structure 380 may provide a force (e.g., a magnetic force) for opening the electronic device (e.g., the electronic device 101 of FIG. 3). For example, the magnetic structure 380 may include a plurality of magnets (e.g., the first magnet 381 and the second magnet 382) facing each other in the state in which the driving element 300 is folded (e.g., FIG. 6 or FIG. 9). The driving element 300 may be unfolded using magnetic forces generated by the plurality of magnets 381 and 382. For example, the driving element 300 may be unfolded using the elastic force generated by the elastic structure 320 and the magnetic force generated by the magnetic structure 380. According to an embodiment, due to the magnetic force of the magnetic structure 380, a force (e.g., elastic force) required by the elastic structure 320 for opening the driving element 300 and/or the electronic device 101 may be reduced. For example, the magnetic structure 380 may include a plurality of magnets (e.g., the first magnet 381 and the second magnet 382) for providing repulsive forces to each other in the state in which the electronic device 101 is closed. The magnitude of the elastic force required in the initial opening of the electronic device 101 may be reduced by the magnetic force provided by the magnetic structure 380.

According to an embodiment, the magnetic structure 380 may include a first magnet 381 disposed in the first arm member 311 and a second magnet 382 disposed in the second arm member 312. The first magnet 381 may include a 1-1th magnet area 381a and a 1-2th magnet area 381b having a polarity different from that of the 1-1th magnet area 381a, and the second magnet 382 may include a 2-1th magnet area 382a facing the 1-1th magnet area 381a and having the same polarity as that of the 1-1th magnet area 381a and a 2-2th magnet area 382b having a polarity different from that of the 2-1th magnet area 382a.

Figure 10:
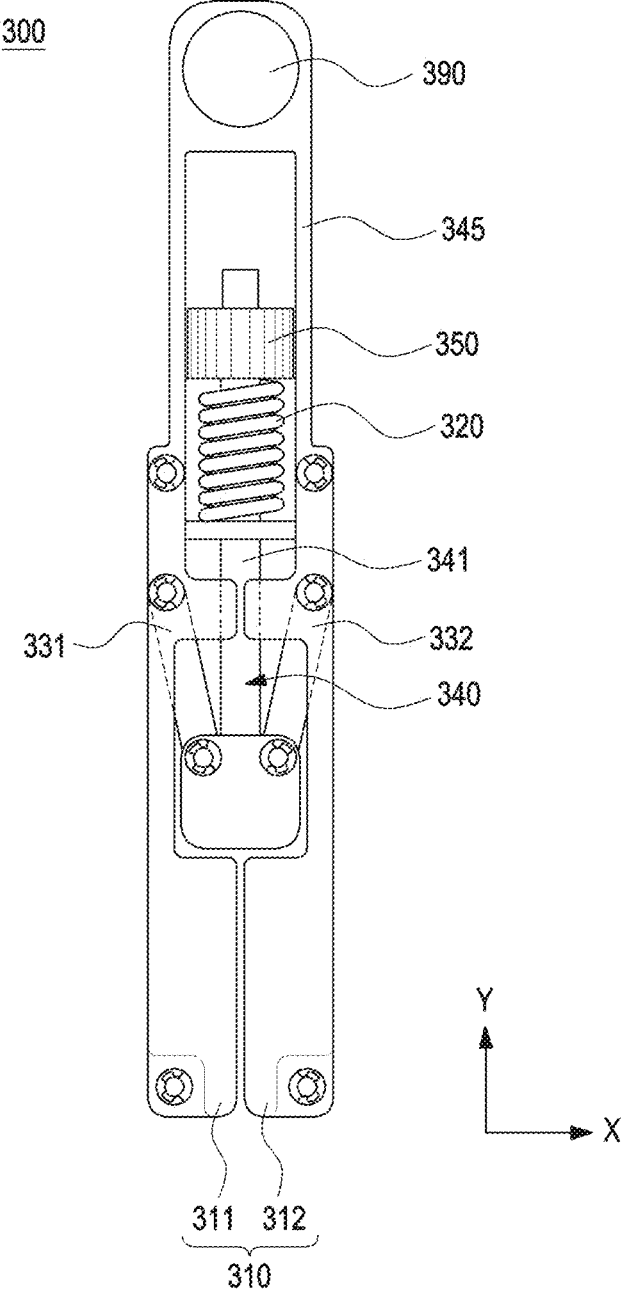
FIG. 10 is a diagram illustrating a front view of a driving element in a closed state including a ball structure according to various embodiments.
Figure 11:
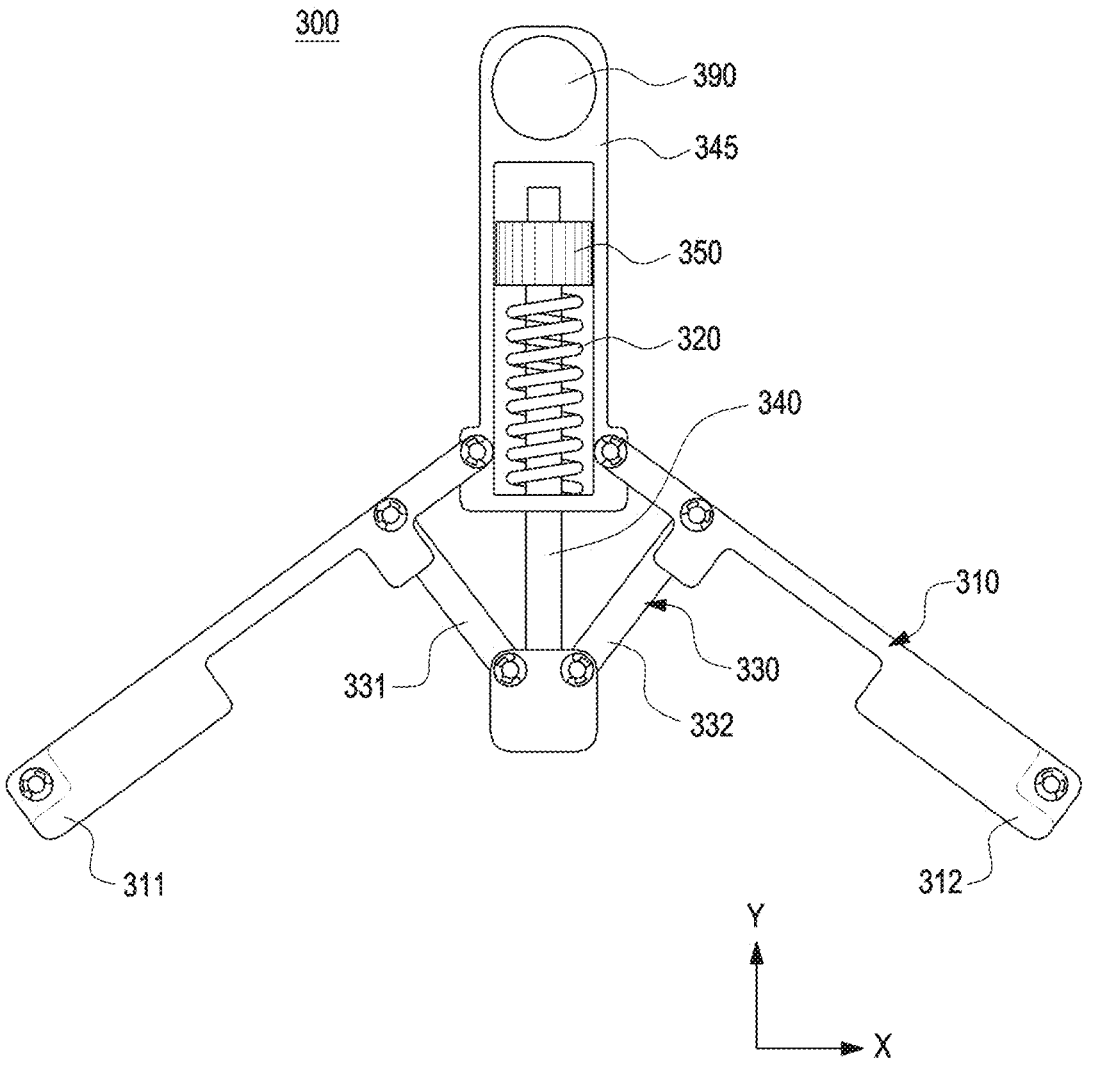
FIG. 11 is a diagram illustrating a front view of a driving element in an open state including a ball structure according to various embodiments.
Figure 12:
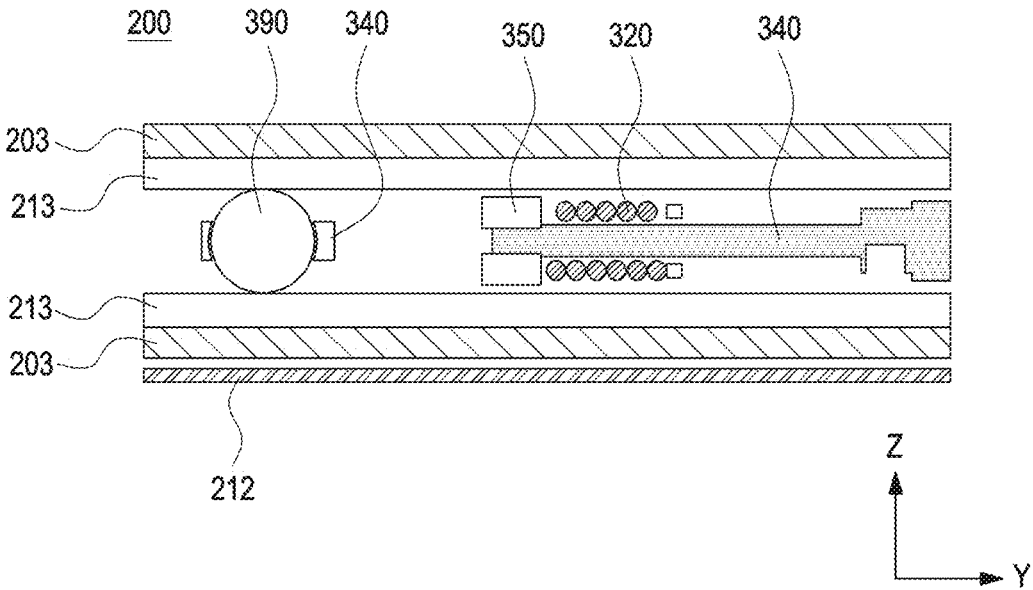
FIG. 12 is a cross-sectional view illustrating an electronic device including a ball structure according to various embodiments.

FIG. 10 is a diagram illustrating a front view of a driving element in a closed state including a ball structure according to various embodiments. FIG. 11 is a diagram illustrating a front view of a driving element in an open state including a ball structure according to various embodiments. FIG. 12 is a cross-sectional view illustrating an electronic device including a ball structure according to various embodiments.

Referring to FIGS. 10, 11, and 12, a driving element 300 may include an arm structure 310, an elastic structure 320, a link structure 330, a shaft structure 340, a fastening structure 350, an interlocking structure 360, a pin structure 370, and/or a ball structure 390.

The configuration of the arm structure 310, the elastic structure 320, the link structure 330, the shaft structure 340, the fastening structure 350, the interlocking structure 360, and the pin structure 370 of FIGS. 10, 11, and/or 12 may be identical in whole or part to the configuration of the arm structure 310, the elastic structure 320, the link structure 330, the shaft structure 340, the fastening structure 350, the interlocking structure 360, and the pin structure 370 of FIGS. 6 and 7, and the configuration of the display 203, the first plate 211, and the multi-bar structure 213 of FIG. 11 may be identical in whole or part to the configuration of the display 203, the first plate 211, and the multi-bar structure 213 of FIG. 4.

According to an embodiment, the shaft structure 340 may include a slide part 345 (e.g., the slide part 343 of FIGS. 6 and 7) receiving the ball structure 390. According to an embodiment, the slide part 345 may move in the second direction (Y-axis direction) based on the slide of the electronic device (e.g., the electronic device 101 of FIG. 3) in the first direction (X-axis direction). According to an embodiment, the slide part 345 may provide a receiving space surrounding at least a portion of the elastic structure 320 and the fastening structure 350.

According to an embodiment, the ball structure 390 may reduce friction between the driving element 300 and a component (e.g., the multi-bar structure 213) of the electronic device 101. According to an embodiment, the ball structure 390 may be rotatably connected to the slide part 345. For example, the ball structure 390 may rotate with respect to the slide part 345 in all directions. When the slide part 345 slides, the ball structure 390 rotates, so that the frictional force transferred to the driving element 300 may be reduced, and damage to the driving element 300 may be reduced or prevented. According to an embodiment, since the ball structure 390 is in contact with the multi-bar structure 213, other components of the driving element 300 may not be in contact with the multi-bar structure 213. For example, the diameter of the ball structure 390 may be longer than the diameter of other components (e.g., the fastening structure 350 and/or the elastic structure 320) of the driving element 300. According to an embodiment, the ball structure 390 may be referred to as a sliding ball or a bearing.

Figure 13A:
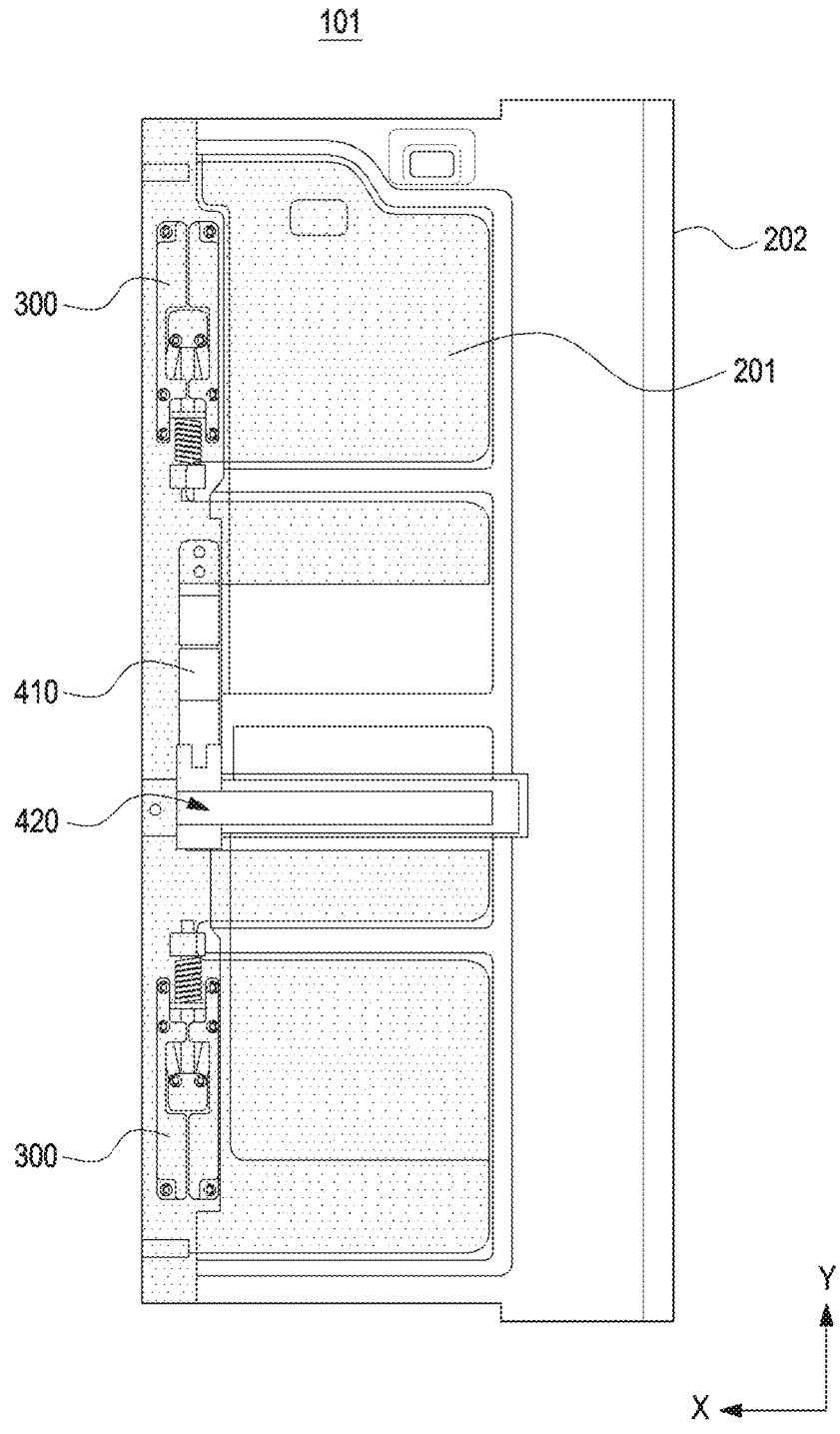
FIG. 13A is a diagram illustrating a front view of an electronic device including a driving element, a motor structure, and a gear structure according to various embodiments.
Figure 13B:
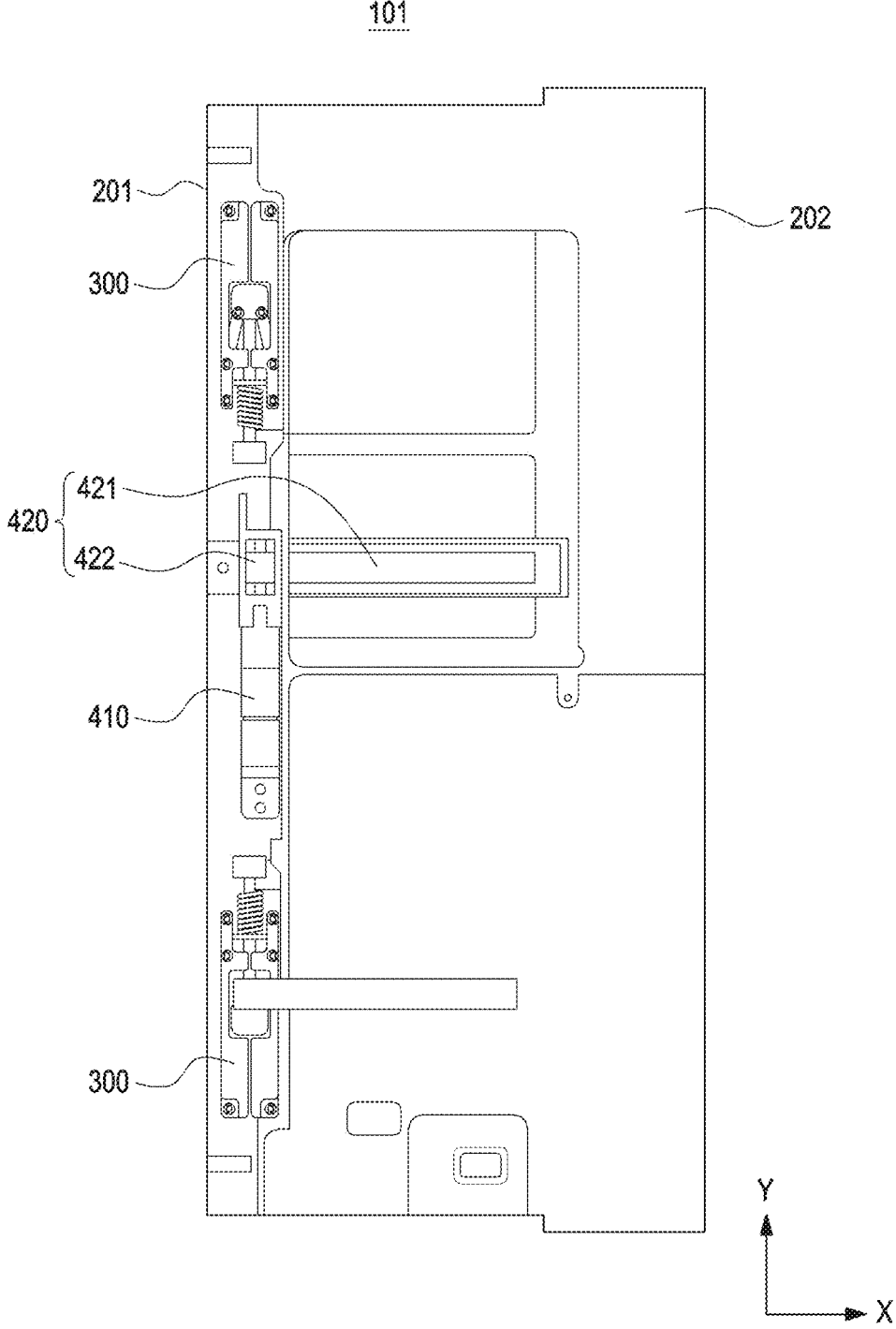
FIG. 13B is a diagram illustrating a rear view of an electronic device including a driving element, a motor structure, and a gear structure according to various embodiments.
Figure 13C:
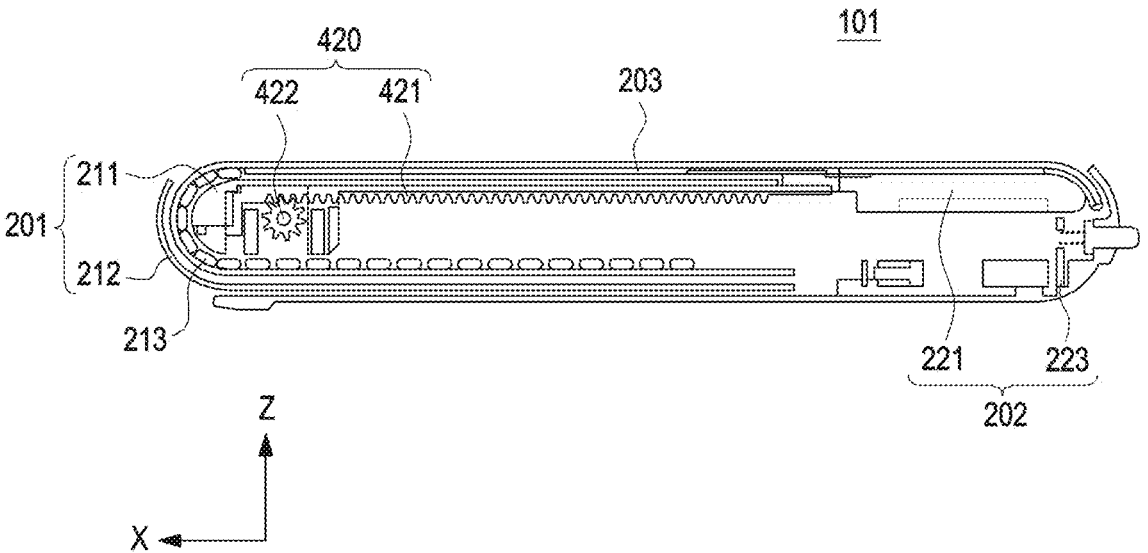
FIG. 13C is a cross-sectional view illustrating an electronic device including a driving element, a motor structure, and a gear structure according to various embodiments.

FIG. 13A is a diagram illustrating a front view of an electronic device including a driving element, a motor structure, and a gear structure according to various embodiments. FIG. 13B is a diagram illustrating a rear view of an electronic device including a driving element, a motor structure, and a gear structure according to various embodiments. FIG. 13C is a cross-sectional view illustrating an electronic device including a driving element, a motor structure, and a gear structure according to various embodiments.

Referring to FIG. 13A, FIG. 13B, and/or FIG. 13C, an electronic device 101 may include a first housing 201, a second housing 202, a display 203, a driving element 300, a motor structure 410, and a gear structure 420. The configuration of the first housing 201, the second housing 202, the display 203, the driving element 300, the motor structure 410, and the gear structure 420 of FIG. 13A, FIG. 13B, and/or FIG. 13C may be identical in whole or part to the configuration of the first housing 201, the second housing 202, the display 203, the driving element 300, the motor structure 410, and/or the gear structure 420 of FIG. 4.

According to an embodiment, the electronic device 101 may perform a slide-in or slide-out operation using the driving element 300, the motor structure 410, and the gear structure 420. For example, the electronic device 101 may slide the first housing 201 with respect to the second housing 202 using the driving force of the motor structure 410 and the elastic force transferred from the driving element 300. For example, the driving element 300 may be changed in length while being connected to a portion (e.g., the first plate 211) of the first housing 201 and a portion (e.g., the second plate 221) of the second housing 202. The motor module 410 may slide the first housing 201 with respect to the second housing 202 by rotating the pinion gear 422 configured to be engaged with a rack gear 421 connected to a portion (e.g., the first plate 211) of the first housing 201.

According to an embodiment, as the force (e.g., elastic force) of the driving element 300 is provided to the first housing 201 and the second housing 202, the magnitude of the force required by the motor structure 410 of the electronic device 101 including the driving element 300 may be less than the magnitude of the force required by the motor of the electronic device not including the driving element 300. According to an embodiment, the magnitude of the force of the motor structure 410, which is reduced due to the force provided from the driving element 300, may be greater at the initial time point of the slide-out operation of the electronic device 101 than at the later time point of the slide-out operation of the electronic device 101.

According to an embodiment, when the electronic device 101 is opened (e.g., slides out), the force F3 required by the electronic device 101 may meet Equation 4 below.

$$F3 = Fac + Fm - Fas \qquad \text{[Equation 4]}$$

Fac may be referred to as a force transferred from the driving element 300 to the first housing 201 and/or the second housing 202. Fm may be referred to as a force generated by the motor structure 410 or a force generated by the motor structure 410 and transferred to the gear structure 420. Fas may be interpreted as a force that disturbs the movement of the electronic device 101. For example, Fas may meet Equation 5 below.

$$Fas = Fgf + Fcf + Fc \qquad \text{[Equation 5]}$$

Fgf may be interpreted as a frictional force between the multi-bar structure 213 and the guide rail (e.g., the guide rail 215 of FIG. 4) generated in the slide-out operation of the electronic device 101. Fcf may be interpreted as a frictional force between the first housing 201 and the second housing 202 generated in the slide-out operation of the electronic device 101. For example, Fcf may be interpreted as a frictional force between a component (e.g., the first plate 211 and/or the slide cover 212) of the first housing 201 and a component (e.g., the second plate 221 and/or the rear plate 223) of the second housing 202. Fc may be interpreted as a repulsive force of the display 203 generated in the slide-out operation of the electronic device 101.

The electronic device (e.g., a portable terminal) includes a display having a flat surface or a flat surface and a curved surface. An electronic device including a display may have a limitation in realizing a screen larger than the size of the electronic device due to the fixed display structure. Accordingly, research has been conducted on electronic devices including a rollable display.

In an electronic device including a rollable display, the rolling or slide of the electronic device may be performed manually using the user's force, or may be performed automatically or semi-automatically using a driving force generated by a component (e.g., a motor) of the electronic device. However, when rolling or slide is performed manually or semi-automatically, a force greater than or equal to the repulsive force of the display is required to open the electronic device, and thus user convenience may be reduced.

According to an embodiment of the disclosure, there may be provided an electronic device including a driving element capable of providing a driving force for a slide of the electronic device.

The disclosure is not limited to the foregoing embodiments but various modifications or changes may rather be made thereto without departing from the spirit and scope of the disclosure.

According to an embodiment of the disclosure, the electronic device may slide the housing using the driving element. As the driving element provides a force for sliding to the housing, the force required to open the electronic device may be reduced, and user convenience may be increased.

According to an embodiment of the disclosure, the driving element may convert the elastic force provided from the elastic structure including a coil spring into a driving force for the slide of the housing. As the elastic structure uses the coil spring, the durability of the driving element may be increased.

According to an example embodiment of the disclosure, an electronic device (e.g., the electronic device 101 of FIG. 3) may comprise: a housing (e.g., the housing 200 of FIG. 3) including a first housing (e.g., the first housing 201 of FIG. 3) and a second housing (e.g., the second housing 202 of FIG. 3) configured to receive at least a portion of the first housing and to guide sliding of the first housing, a display (e.g., the display 203 of FIG. 3) configured to be extended based on sliding of the first housing, and a driving element (e.g., the driving element 300 of FIG. 5) configured to provide a driving force for the slide of the first housing. The driving element may include a shaft structure (e.g., the shaft structure 340 of FIG. 6) including a shaft (e.g., the shaft 341 of FIG. 6) and a slide part (e.g., the slide part 343 of FIG. 6) configured to slide with respect to the shaft, an arm structure (e.g., the arm structure 310 of FIG. 6) including a first arm (e.g., the first arm member 311 of FIG. 6) rotatably connected to the first housing and the slide part and a second arm (e.g., the second arm member 312 of FIG. 6) rotatably connected to the second housing and the slide part, an elastic structure comprising a spring (e.g., the elastic structure 320 of FIG. 6) surrounding at least a portion of the shaft and configured to provide an elastic force to the slide part, and a link structure (e.g., the link structure 330 of FIG. 6) including a first link (e.g., the first link member 331 of FIG. 6) rotatably connected to the shaft and the first arm and a second link (e.g., the second link member 332 of FIG. 6) rotatably connected to the shaft and the second arm.

According to an example embodiment, the first housing may be configured to slide in a first direction (e.g., the first direction (X-axis direction) of FIG. 7) with respect to the second housing, and the elastic structure may be configured to be compressed or extended in a second direction (e.g., the Y-axis direction) perpendicular to the first direction.

According to an example embodiment, the first arm may include a first end portion (e.g., the first end portion 311*a* of FIG. 7) rotatably connected to the first housing and a second end portion (e.g., the second end portion 311*b* of FIG. 7) rotatably connected to the slide part, and the second arm may include a third end portion (e.g., the third end portion 312*a* of FIG. 7) rotatably connected to the second housing and a fourth end portion (e.g., the fourth end portion 312*b* of FIG. 7) rotatably connected to the slide part.

According to an example embodiment, the first arm may include a first connection area (e.g., the first connection area 311*c* of FIG. 7) positioned between the first end portion and the second end portion. The second arm may include a second connection area (e.g., the second connection area 312*c* of FIG. 7) positioned between the third end portion and the fourth end portion. The first link may include a fifth end portion (e.g., the fifth end portion 331*a* of FIG. 7) connected to the shaft and a sixth end portion (e.g., the sixth end portion 331*b* of FIG. 7) opposite to the fifth end portion and connected to the first connection area. The second link may include a seventh end portion (e.g., the seventh end portion 332*a* of FIG. 7) connected to the shaft and an eighth end portion (e.g., the eighth end portion 332*b* of FIG. 7) opposite to the seventh end portion and connected to the second connection area.

According to an example embodiment, the driving element may include a fastener (e.g., the fastening structure 350 of FIG. 7) configured to adjust a length of the elastic structure, as a fastener connected to the shaft.

According to an example embodiment, the driving element may include an interlocking structure (e.g., the interlocking structure 360 of FIG. 7) including a first gear (e.g., the first gear 361 of FIG. 7) connected to the first link and a second gear (e.g., the second gear 362 of FIG. 7) connected to the second link and configured to be engaged with the first gear.

According to an example embodiment, the driving element may include a ball structure comprising at least one ball (e.g., the ball structure 390 of FIG. 10) rotatably connected to the slide part. A first diameter (e.g., the first diameter b1 of FIG. 11) of the ball structure may be greater than a second diameter (e.g., the second diameter b2 of FIG. 11) of the elastic structure.

According to an example embodiment, the first housing may include a first plate (e.g., the first plate 211 of FIG. 4) supporting at least a portion of the display and configured to provide pressure to the display. The second housing may include a second plate (e.g., the second plate 221 of FIG. 4) supporting at least a portion of the display.

According to an example embodiment, the first arm may be connected to the first plate, and the second arm may be connected to the second plate.

According to an example embodiment, the driving element may include a magnetic structure (e.g., the magnetic structure 380 of FIG. 9) including a first magnet (e.g., the first magnet 381 of FIG. 9) disposed in the first arm and a second magnet (e.g., the second magnet 382 of FIG. 9) disposed in the second arm.

According to an example embodiment, the driving element may include a first pin (e.g., the first pin 371 of FIG. 7) including a first first pin (e.g., the 1-1th pin 371a of FIG. 7) connecting the first housing and a first end portion (e.g., the first end portion 311a of FIG. 7) of the first arm and a second first pin (e.g., 1-2th pin 371b of FIG. 7) connecting the second housing and a third end portion (e.g., the third end portion 312a of FIG. 7) of the second housing, a second pin structure (e.g., the second pin 372 of FIG. 7) including a first second pin (e.g., 2-1th pin 372a of FIG. 7) connecting a fifth end portion (e.g., the fifth end portion 331a of FIG. 7) of the first link and the shaft and a second second pin (e.g., the 2-2th pin 372b of FIG. 7) connecting a seventh end portion (e.g., the seventh end portion 332a of FIG. 7) of the second link and the shaft, a third pin (e.g., the third pin 373 of FIG. 7) including a first third pin (e.g., the 3-1th pin 373a of FIG. 7) connected to a sixth end portion (e.g., the sixth end portion 331b of FIG. 7) of the first link, opposite to the fifth end portion, and a first connection area (e.g., the first connection area 311c of FIG. 7) of the first arm and a second third pin (e.g., the 3-2th pin 373b of FIG. 7) connected to an eighth end portion (e.g., the eighth end portion 332b of FIG. 7) of the second link, opposite to the seventh end portion, and a second connection area (e.g., the second connection area 312c of FIG. 7) of the second arm, and a fourth pin (e.g., the fourth pin 374 of FIG. 7) including a first fourth pin (e.g., the 4-1th pin 374a of FIG. 7) connected to a second end portion (e.g., the second end portion 311b of FIG. 7) of the first arm and the slide part and a second fourth pin (e.g., the 4-2th pin 374b of FIG. 7) connected to a fourth end portion (e.g., the fourth end portion 312b of FIG. 7) of the second arm and the slide part.

According to an example embodiment, the first arm may be configured to rotate with respect to the slide part, about the first fourth pin, and the second arm is configured to rotate with respect to the slide part, about the second fourth pin, and the first link may be configured to rotate with respect to the shaft, about the first second pin, and the second link is configured to rotate with respect to the shaft, about the second second pin.

According to an example embodiment, the elastic structure may include a coil spring, a leaf spring, and/or a gas spring.

According to an example embodiment, the display may include a first display area (e.g., the first display area A1 of FIG. 4) visible to an outside of the electronic device and a second display area (e.g., the second display area A2 of FIG. 4) extending from the first display area and configured to be extended based on sliding of the first housing. The electronic device may further comprise a multi-bar structure comprising multiple bars (e.g., the multi-bar structure 213 of FIG. 4) supporting at least a portion of the second display area and a guide rail (e.g., the guide rail 215 of FIG. 4) configured to guide a movement of the multi-bar structure and connected to the first housing.

According to an example embodiment, the shaft may include a first shaft area (e.g., the first shaft area 341a of FIG. 7) surrounded by the elastic structure and a second shaft area (e.g., the second shaft area 341b of FIG. 7) extending from the first shaft area and connected to the link structure.

According to an example embodiment, the electronic device may further comprise a motor (e.g., the motor structure 410 of FIG. 40) connected to the second housing and configured to generate at least a portion of the driving force for sliding of the first housing and a gear structure (e.g., the gear structure 420 of FIG. 4) including a pinion gear configured to rotate based on a driving force generated by the motor structure and a rack gear (e.g., the rack gear 421 of FIG. 4) connected to the first housing and configured to move based on the driving force generated by the motor.

According to an example embodiment of the disclosure, an electronic device (e.g., the electronic device 101 of FIG. 3) may comprise: a housing (e.g., the housing 200 of FIG. 3) including a first housing (e.g., the first housing 201 of FIG. 3) and a second housing (e.g., the second housing 202 of FIG. 3) configured to receive at least a portion of the first housing and guide sliding of the first housing, a display (e.g., the display 203 of FIG. 3), that at least a portion of which is configured to be extended based on sliding of the first housing, and a driving element (e.g., the driving element 300 of FIG. 5) configured to provide a driving force for the slide of the first housing. The driving element may include a shaft (e.g., the shaft structure 340 of FIG. 6), an arm (e.g., the arm structure 310 of FIG. 6) including a first arm (e.g., the first arm member 311 of FIG. 6) including a first end portion (e.g., the first end portion 311a of FIG. 6) rotatably connected to the first housing and a second end portion (e.g., the second end portion 311b of FIG. 6) rotatably connected to the shaft structure and a second arm (e.g., the second arm member 312 of FIG. 6) including a third end portion (e.g., the third end portion 312a of FIG. 6) rotatably connected to the second housing and a fourth end portion (e.g., the fourth end portion 312b of FIG. 6) rotatably connected to the shaft structure, an elastic structure comprising a spring connected to the shaft structure and configured to provide an elastic force to the shaft structure, and a link structure (e.g., the link structure 330 of FIG. 6) including a first link (e.g., the first link member 331 of FIG. 6) rotatably connected to the shaft structure and the first arm and a second link (e.g., the second link member 332 of FIG. 6) rotatably connected to the shaft structure and the second arm.

According to an example embodiment of the disclosure, a driving element (e.g., the driving element 300 of FIG. 5) may comprise a shaft structure (e.g., the shaft structure 340 of FIG. 6) including a shaft (e.g., the shaft 341 of FIG. 6) and a slide part (e.g., the slide part 343 of FIG. 6) configured to slide with respect to the shaft, an arm structure (e.g., the arm structure 310 of FIG. 6) including a first arm (e.g., the first arm member 311 of FIG. 6) including a first end portion (e.g., the first end portion 311a of FIG. 6) and a second end portion (e.g., the second end portion 311b of FIG. 6) rotatably connected to the shaft structure and a second arm (e.g., the second arm member 312 of FIG. 6) including a third end portion (e.g., the third end portion 312a of FIG. 6) and a fourth end portion (e.g., the fourth end portion 312b of FIG. 6) rotatably connected to the shaft structure, an elastic structure comprising a spring (e.g., the elastic structure 320 of FIG. 6) surrounding at least a portion of the shaft and configured to provide an elastic force to the slide part, and a link structure (e.g., the link structure 330 of FIG. 6) including a first link (e.g., the first link member 331 of FIG. 6) rotatably connected to the shaft and the first arm and a second link (e.g., the second link member 332 of FIG. 6) rotatably connected to the shaft and the second arm.

It is apparent to one of ordinary skill in the art that an electronic device including a driving element as described above are not limited to the above-described embodiments and those shown in the drawings, and various changes, modifications, or alterations may be made thereto without departing from the scope of the disclosure. It will also be understood that any of the embodiment(s) described herein may be used in conjunction with any other embodiment(s) described herein.

What is claimed is:

1. An electronic device, comprising:
a housing including a first housing and a second housing configured to receive at least a portion of the first housing and guide a slide movement of the first housing;
a display, wherein at least a portion of the display is configured to be deformable based on the slide movement of the first housing; and
a driving element configured to provide a driving force for the slide movement of the first housing, wherein the driving element includes:
a shaft structure including a shaft and a slide part configured to slide with respect to the shaft;
an arm structure including a first arm rotatably connected to the first housing and the slide part and a second arm rotatably connected to the second housing and the slide part;
an elastic structure comprising a spring surrounding at least a portion of the shaft and configured to provide an elastic force to the slide part; and
a link structure including a first link rotatably connected to the shaft and the first arm and a second link rotatably connected to the shaft and the second arm.

2. The electronic device of claim 1, wherein the first housing is configured to slide in a first direction with respect to the second housing, and
wherein the elastic structure is configured to be compressed or extended in a second direction perpendicular to the first direction.

3. The electronic device of claim 1, wherein the first arm includes a first end portion rotatably connected to the first housing and a second end portion rotatably connected to the slide part, and
wherein the second arm includes a third end portion rotatably connected to the second housing and a fourth end portion rotatably connected to the slide part.

4. The electronic device of claim 1, wherein the first arm includes a first connection area positioned between the first end portion and the second end portion,
wherein the second arm includes a second connection area positioned between the third end portion and the fourth end portion,
wherein the first link includes a fifth end portion connected to the shaft and a sixth end portion opposite to the fifth end portion and connected to the first connection area, and
wherein the second link includes a seventh end portion connected to the shaft and an eighth end portion opposite to the seventh end portion and connected to the second connection area.

5. The electronic device of claim 1, wherein the driving element further includes a fastener configured to adjust a length of the elastic structure, and connected to the shaft.

6. The electronic device of claim 1, wherein the driving element includes an interlocking structure including a first gear connected to the first link and a second gear connected to the second link and configured to be engaged with the first gear.

7. The electronic device of claim 1, wherein the driving element includes a ball structure comprising at least one ball rotatably connected to the slide part, and
wherein a first diameter of the ball structure is greater than a second diameter of the elastic structure.

8. The electronic device of claim 1, wherein the first housing includes a first plate configured to support at least a portion of the display and provide pressure to the display,
wherein the second housing includes a second plate configured to support at least a portion of the display, and
wherein the first arm is connected to the first plate, and the second arm is connected to the second plate.

9. The electronic device of claim 1, wherein the elastic structure includes a coil spring.

10. The electronic device of claim 1, wherein the driving element includes a magnetic structure including a first magnet disposed in the first arm and a second magnet disposed in the second arm.

11. The electronic device of claim 1, wherein the driving element includes:
a first pin including a first first pin connecting the first housing and a first end portion of the first arm and a second first pin connecting the second housing and a third end portion of the second housing;
a second pin structure including a first second pin connecting a fifth end portion of the first link and the shaft and a second second pin connecting a seventh end portion of the second link and the shaft;
a third pin including a first third pin connected to a sixth end portion of the first link, opposite to the fifth end portion, and a first connection area of the first arm and a second third pin connected to an eighth end portion of the second link, opposite to the seventh end portion, and a second connection area of the second arm; and
a fourth pin including a first fourth pin connected to a second end portion of the first arm and the slide part and a second fourth pin connected to a fourth end portion of the second arm and the slide part.

12. The electronic device of claim 1, wherein the first arm is configured to rotate with respect to the slide part about the first fourth pin, and the second arm is configured to rotate with respect to the slide part about the second fourth pin, and
wherein the first link is configured to rotate with respect to the shaft about the first second pin, and the second link is configured to rotate with respect to the shaft about the second second pin.

13. The electronic device of claim 1, wherein the display includes a first display area visible to an outside of the electronic device and a second display area extending from the first display area and configured to be extended based on the slide movement of the first housing, and wherein the electronic device further comprises:
a multi-bar structure comprising multiple bars configured to support at least a portion of the second display area; and a guide rail configured to guide a movement of the multi-bar structure and connected to the first housing.

14. The electronic device of claim 1, wherein the shaft includes a first shaft area surrounded by the elastic structure and a second shaft area extending from the first shaft area and connected to the link structure.

15. The electronic device of claim 1, further comprising:

a motor structure comprising a motor connected to the second housing and configured to generate at least a portion of the driving force for the slide movement of the first housing; and a gear structure including a pinion gear configured to rotate based on a driving force generated by the motor structure and a rack gear connected to the first housing and configured to move based on the driving force generated by the motor structure.

* * * * *